(12) United States Patent
Igarashi et al.

(10) Patent No.: US 7,384,279 B2
(45) Date of Patent: Jun. 10, 2008

(54) ANISOTROPIC CONDUCTIVE CONNECTOR AND WAFER INSPECTION DEVICE

(75) Inventors: Hisao Igarashi, Tokyo (JP); Katsumi Sato, Tokyo (JP); Kazuo Inoue, Tokyo (JP)

(73) Assignee: JSR Corporation, Tokyo (JP)

(*) Notice: Subject to any disclaimer, the term of this patent is extended or adjusted under 35 U.S.C. 154(b) by 155 days.

(21) Appl. No.: 10/559,846

(22) PCT Filed: Jun. 1, 2004

(86) PCT No.: PCT/JP2004/007515

§ 371 (c)(1),
(2), (4) Date: Dec. 7, 2005

(87) PCT Pub. No.: WO2004/109302

PCT Pub. Date: Dec. 16, 2004

(65) Prior Publication Data

US 2006/0154500 A1    Jul. 13, 2006

(30) Foreign Application Priority Data

Jun. 9, 2003    (JP) .............................. 2003-163866

(51) Int. Cl.
    *H01R 4/58* (2006.01)
(52) U.S. Cl. .......................................... 439/91; 439/66
(58) Field of Classification Search ............. 439/66, 439/91, 86
    See application file for complete search history.

(56) References Cited

U.S. PATENT DOCUMENTS 4,902,857 A * 2/1990 Cranston et al. .......... 174/94 R
5,586,892 A * 12/1996 Sato ............................ 439/91
6,168,442 B1    1/2001 Naoi ............................. 439/91

(Continued)

FOREIGN PATENT DOCUMENTS

JP    2002-184821    6/2002

(Continued)

OTHER PUBLICATIONS

U.S. Appl. No. 10/552,995, filed Oct. 13, 2005, Sato et al.

(Continued)

*Primary Examiner*—Hae Moon Hyeon
(74) *Attorney, Agent, or Firm*—Oblon, Spivak, McClelland, Maier & Neustadt, P.C.

(57) ABSTRACT

An anisotropically conductive connector suitable for use in a wafer inspection apparatus, and a wafer inspection apparatus comprising the anisotropically conductive connector, which anisotropically conductive connector comprises an elastic anisotropically conductive film composed of a plurality of conductive parts for connection and an insulating part formed among these conductive parts for connection, and a frame plate for supporting this film, which plate is formed of a metallic material having a coefficient of linear thermal expansion of $3\times10^{-6}$ to $2\times10^{-5}\,\text{K}^{-1}$, the conductive parts for connection are obtained by filling conductive particles having a number average particle diameter of 20 to 80 µm and exhibiting magnetism in an elastic polymeric substance at a high density, the conductive particles have, on a surface of which, a coating layer composed of a noble metal and having a thickness of at least 20 nm, each of the conductive parts for connection has a durometer hardness of 10 to 35, and an electric resistance between the conductive parts for connection is at least 10 MΩ.

10 Claims, 9 Drawing Sheets

U.S. PATENT DOCUMENTS

| | | | |
|---|---|---|---|
| 6,332,786 B1 * | 12/2001 | Suga et al. | 439/91 |
| 6,604,953 B2 * | 8/2003 | Igarashi et al. | 439/91 |
| 6,690,564 B1 * | 2/2004 | Haruta et al. | 361/212 |
| 6,720,787 B2 * | 4/2004 | Kimura et al. | 324/765 |
| 6,870,385 B2 * | 3/2005 | Inoue et al. | 324/765 |
| 6,969,622 B1 * | 11/2005 | Kokubo et al. | 438/14 |
| 2006/0154500 A1 | 7/2006 | Igarashi et al. | |

FOREIGN PATENT DOCUMENTS

| | | |
|---|---|---|
| JP | 2002-246428 | 8/2002 |
| JP | WO 02/065588 A1 * | 8/2002 |
| JP | 2003-77962 | 3/2003 |
| KR | 2000-0045941 | 7/2000 |

OTHER PUBLICATIONS

U.S. Appl. No. 10/559,846, filed Dec. 7, 2005, Igarashi et al.
U.S. Appl. No. 10/560,347, filed Dec. 12, 2005, Yamada et al.
U.S. Appl. No. 11/837,873, filed Aug. 13, 2007, Sato, et al.

* cited by examiner

US 7,384,279 B2

ANISOTROPIC CONDUCTIVE CONNECTOR AND WAFER INSPECTION DEVICE

CROSS-REFERENCES TO RELATED APPLICATIONS

This application is a 371 of PCT/JP04/07515, filed Jun. 1, 2004, which claims the benefit under 35 U.S.C. § 119 of JP 2003-163866, filed Jun. 9, 2003.

TECHNICAL FIELD

The present invention relates to a wafer inspection apparatus and an anisotropically conductive connector suitable for use in this wafer inspection apparatus, and particularly to a wafer inspection apparatus for collectively conducting a probe test as to a part or all of a great number of integrated circuits formed on a wafer or a wafer inspection apparatus for collectively conducting a burn-in test as to a part or all of a great number of integrated circuits formed on a wafer, and an anisotropically conductive connector suitable for use in these wafer inspection apparatus.

BACKGROUND ART

In the production process of semiconductor integrated circuit devices, after a great number of integrated circuits are formed on a wafer, a probe test is generally conducted as to each of these integrated circuits. This wafer is then cut, thereby forming semiconductor chips. Such semiconductor chips are contained and sealed in respective proper packages. Each of the packaged semiconductor integrated circuit devices is further subjected to a burn-in test. In order to give a quality certification to a semiconductor integrated circuit device, it is extremely important to not only inspect electrical properties of the semiconductor integrated circuit device by the burn-in test, but also inspect electrical properties of the semiconductor chip itself. Besides, in recent years, there has been developed a mounting method that a semiconductor chip itself is used as an integrated circuit device to directly mount a circuit device composed of the semiconductor chip on a printed circuit board. Therefore, there is a demand for guaranteeing the quality of the semiconductor chip itself.

Since the semiconductor chip is minute, and its handling is inconvenient, the inspection of the circuit device composed of the semiconductor chip is complicated, and so it takes a long time to conduct the inspection, and inspection cost thus becomes considerably high.

From such reasons, attention has been recently paid to a WLBI (Wafer Level Burn-in) test in which the electrical properties of a circuit device composed of a semiconductor chip are inspected in the state of a wafer.

On the other hand, in the probe test conducted on integrated circuits formed on a wafer, a method, in which a probe test is collectively performed on, for example, 16 or 32 integrated circuits among a great number of integrated circuits formed on a wafer, and the probe test is successively performed on other integrated circuits, is generally adopted.

In recent years, there has been a demand for collectively performing a probe test on, for example, 64, 124 or all integrated circuits among a great number of integrated circuits formed on a wafer for the purpose of improving inspection efficiency and reducing inspection cost.

FIG. 18 is a cross-sectional view schematically illustrating the construction of an exemplary conventional wafer inspection apparatus for conducting the WLBI test or probe test as to a wafer on which a great number of integrated circuits have been formed. Such wafer inspection apparatus are described in, for example, Prior Art. 1 and Prior Art. 2.

This wafer inspection apparatus has a circuit board 80 for inspection, on the front surface (lower surface in the figure) of which a great number of inspection electrodes 81 have been formed, and a probe card 90 is arranged on the front surface of the circuit board 80 for inspection through a connector 85. This probe card 90 is constructed by a circuit board 91 for connection and a contact member 95 provided on the front surface (lower surface in the figure) of the circuit board 90 for connection and having a great number of contacts (not illustrated) brought into contact with electrodes (not illustrated) to be inspected of integrated circuits in a wafer 1 that is an object of inspection. A wafer tray 96 also serves as a heating plate, on which the wafer 1 that is the object of inspection is mounted, is arranged under the contact member 95. Reference numeral 97 indicates a pressurizing mechanism for pressurizing the circuit board 80 for inspection downward.

On a back surface of the circuit board 91 for connection in the probe card 90, a great number of terminal electrodes 92 are formed in accordance with a pattern corresponding to a pattern of the inspection electrodes 81 of the circuit board 80 for inspection, and the circuit board 91 for connection is arranged in such a manner that the terminal electrodes 92 are respectively opposed to the inspection electrodes 81 of the circuit board 80 for inspection by guide pins 93.

In the connector 85, a great number of connecting pins 86 called "pogo pins", which can be elastically compressed in a lengthwise direction thereof are arranged in accordance with the pattern corresponding to the pattern of the inspection electrodes 81 of the circuit board 80 for inspection. The connector 85 is arranged in a state that the connecting pins 86 have been respectively located between the inspection electrodes 81 of the circuit board 80 for inspection and the terminal electrodes 92 of the circuit board 91 for connection.

In the wafer inspection apparatus shown in FIG. 18, the wafer 1 that is the object of inspection is mounted on the wafer tray 96, and the circuit board 80 for inspection is pressurized downward by the pressurizing mechanism 97, whereby each of the connecting pins 86 of the connector 85 are elastically compressed in the lengthwise direction. As a result, the inspection electrodes 81 of the circuit board 80 for inspection are electrically connected to their corresponding terminal electrodes 92 of the circuit board 91 for connection, and the respective contacts of the contact member 95 come into contact with electrodes to be inspected of a part of the integrated circuits formed on the wafer 1, thereby achieving necessary electrical connection. The wafer 1 is then heated to a predetermined temperature by the wafer tray 96 to perform necessary electrical inspection (WLBI test or probe test) as to the wafer 1 in this state.

However, the conventional wafer inspection apparatus shown in FIG. 18 involves such problems as described below.

In this wafer inspection apparatus, it is necessary to pressurize the respective connecting pins 86 under pressurizing force of, for example, about 0.8 N (about 0.08 kgf) per pin for the purpose of achieving stable electrical connection of the inspection electrodes 81 of the circuit board 80 for inspection to their corresponding terminal electrodes 92 of the circuit board 91 for connection. Accordingly, for example, when the number of the inspection electrodes 81 of the circuit board 80 for inspection is, for example, 5,000, pressurizing force of about 4,000 N is required as a whole. Therefore, the apparatus involves a problem that the pressurizing mechanism 97 for applying such pressurizing force inevitably becomes large in size, so that the whole wafer inspection apparatus becomes considerably large in size.

The apparatus also involves a problem that the service life of the circuit board 80 for inspection is shortened because each of the inspection electrodes 81 of the circuit board 80 for inspection are pressurized under great pressurizing force by the respective connecting pins 86, whereby the inspection electrodes 81 are liable to be damaged, and in turn, inspection cost is increased.

There is a limit to a reduction in length of the connecting pins 86 from the constraint of mechanism, and the connecting pins are actually required to have a length of about 3 cm. Therefore, a clearance between the circuit board 80 for inspection and the circuit board 91 for connection becomes considerably long. As a result, it is difficult to reduce the size of the wafer inspection apparatus in a height-wise direction. In this respect, the apparatus also involves a problem that the whole wafer inspection apparatus cannot be miniaturized. In particular, there has recently been proposed a wafer inspection apparatus constructed by stacking a plurality of inspection units each composed of the respective components shown in, for example, FIG. 18 for the purpose of performing inspection as to a plurality of wafers in a small operating space in parallel. In such a wafer inspection apparatus, it is extremely important from the viewpoint of miniaturizing the apparatus to reduce the size of each inspection unit in a height-wise direction because the whole wafer inspection apparatus becomes considerably large when the size of each inspection unit in the height-wise direction is large.

Since the connecting pins 86 require to have a considerably long length, a distance of a signal transmission system becomes considerably long, so that a problem that the apparatus is difficult to be adapted to electrical inspection as to high functional integrated circuits of which high-speed processing is required arises.

Prior Art. 1: Japanese Patent Application Laid-Open No. 2000-147036;

Prior Art. 2: Japanese Patent Application Laid-Open No. 2000-323535.

DISCLOSURE OF THE INVENTION

The present invention has been made on the basis of the foregoing circumstances and has as its object the provision of a wafer inspection apparatus which is suitable for use in conducting electrical inspection of a great number of integrated circuits formed on a wafer, capable of being miniaturized as a whole, is prevented from shortening the service life of its circuit board for inspection, capable of collectively performing inspection as to a great number of electrodes to be inspected, has good electrical properties and capable of performing electrical inspection as to high functional integrated circuits, and an anisotropically conductive connector suitable for use in this wafer inspection apparatus.

According to the present invention, there is thus provided an anisotropically conductive connector comprising an elastic anisotropically conductive film composed of a plurality of conductive parts for connection each extending in a thickness-wise direction of the film and arranged in a state separated from each other along a plane direction of the film and an insulating part formed among these conductive parts for connection, and a frame plate for supporting the elastic anisotropically conductive film, wherein the frame plate is formed of a metallic material having a coefficient of linear thermal expansion of $3 \times 10^{-6}$ to $2 \times 10^{-5}$ $K^{-1}$, the conductive parts for connection in the elastic anisotropically conductive film are obtained by filling conductive particles having a number average particle diameter of 20 to 80 µm and exhibiting magnetism in an elastic polymeric substance at a high density, the conductive particles have, on a surface of which, a coating layer composed of a noble metal and having a thickness of at least 20 nm, each of the conductive parts for connection has a durometer hardness of 10 to 35, and an electric resistance between conductive parts for connection adjoining each other is at least 10 MΩ.

In the anisotropically conductive connector according to the present invention, it is preferable that the frame plate has at least one through-hole extending in the thickness-wise direction, and the elastic anisotropically conductive film be arranged in such a manner that the conductive parts for connection thereof are located within the through-hole in the frame plate.

It is also preferable that the frame plate has a plurality of through-holes each extending in the thickness-wise direction, and the elastic anisotropically conductive film be arranged in such a manner that the conductive parts for connection thereof are located within the respective through-holes in the frame plate.

In the anisotropically conductive connector according to the present invention, an allowable current value of each of the conductive parts for connection when the conductive part for connection is pressurized in the thickness-wise direction under a load of 20 g may preferably be at least 1 A.

An allowable current value of each of the conductive parts for connection when the conductive part for connection is pressurized in the thickness-wise direction so as to give a distortion factor of 20% may preferably be at least 1 A.

In the anisotropically conductive connector according to the present invention, it may be preferable that an electric resistance of each of the conductive parts for connection in the thickness-wise direction as measured in a state that the conductive part for connection has been pressurized in the thickness-wise direction under a load of 20 g be at most 0.1 Ω, and an electric resistance of the conductive part for connection in the thickness-wise direction as measured in a state that the conductive part for connection has been pressurized in the thickness-wise direction under a load of 20 g after a cycle that the conductive part for connection is pressurized for 15 minutes in the thickness-wise direction under a load of 20 g in an environment of 80° C. in temperature, and the conductive part for connection is then held for 5 minutes in an unloaded state was repeated 3,000 times be at most 0.1Ω.

In the anisotropically conductive connector according to the present invention, it may be preferable that an electric resistance of each of the conductive parts for connection in the thickness-wise direction as measured in a state that the conductive part for connection has been pressurized in the thickness-wise direction so as to give a distortion factor of 20% be at most 0.1 Ω, and an electric resistance of the conductive part for connection in the thickness-wise direction as measured after a current of 1 A is applied to the conductive part for connection for 3,000 hours in a state that the conductive part for connection had been pressurized in the thickness-wise direction in an environment of 80° C. in temperature so as to give a distortion factor of 20% be at most 0.1Ω.

According to the present invention, there is also provided a wafer inspection apparatus for performing electrical inspection of a great number of integrated circuits formed on a wafer, which comprises:

a circuit board for inspection having a great number of inspection electrodes on a front surface thereof;

a probe card having a circuit board for connection, on the back surface of which a plurality of terminal electrodes have been formed in accordance with a pattern corresponding to a pattern of the inspection electrodes of the circuit board for inspection, and a contact member, which is provided on the front surface of the circuit board for connection, and on which a great number of contacts brought into contact with respective electrodes to be inspected of the integrated circuits on the wafer, which is an object of inspection, have been arranged, and arranged in such a manner that the terminal electrodes of the circuit board for connection are opposed to their corresponding inspection electrodes of the circuit board for inspection; and an anisotropically conductive connector of the construction described above, which is arranged between the circuit board for inspection and the circuit board for connection in the probe card to respectively electrically connect the inspection electrodes to the terminal electrodes.

In the wafer inspection apparatus according to the present invention, the three of the circuit board for inspection, the anisotropically conductive connector and the circuit board for connection may be fixed in a state that the elastic anisotropically conductive film in the anisotropically conductive connector has been held and pressurized by the circuit board for inspection and the circuit board for connection, thereby the inspection electrodes in the circuit board for inspection and their corresponding terminal electrodes in the circuit board for connection are electrically connected through the conductive parts for connection in the anisotropically conductive connector.

The wafer inspection apparatus according to the present invention may comprise a pressurizing mechanism for pressurizing the circuit board for inspection to electrically connect the respective contacts of the contact member in the probe card to the electrodes to be inspected in the wafer, which is the object of inspection, wherein the circuit board for inspection is pressurized by the pressurizing mechanism, whereby the elastic anisotropically conductive film in the anisotropically conductive connector is held and pressurized by the circuit board for inspection and the circuit board for connection, thereby the inspection electrodes in the circuit board for inspection and their corresponding terminal electrodes in the circuit board for connection are electrically connected through the conductive parts for connection in the anisotropically conductive connector.

According to the anisotropically conductive connector of the present invention, the elastic anisotropically conductive film is supported by the frame plate formed of a metallic material, so that the whole of the anisotropically conductive connector is not greatly deformed when the frame plate is held, whereby a positioning operation of the anisotropically conductive connector to electrodes intended to be connected can be conducted with ease.

Since the metallic material forming the frame plate has a low coefficient of linear thermal expansion, the frame plate has excellent dimensional stability even in changes of temperature environment, whereby a good electrically connected state can be stably retained.

Since the conductive parts for connection in the elastic anisotropically conductive film are obtained by filling the specific conductive particles in the elastic polymeric substance having the durometer hardness falling within the specific range, high conductivity is achieved, and moreover an electrically connected state to electrodes intended to be connected is stably achieved.

Since the electric resistance between the conductive parts for connection is at least 10 MΩ, high reliability on connection to electrodes intended to be connected is achieved.

Accordingly, the anisotropically conductive connector according to the present invention can be suitably used in a wafer inspection apparatus.

According to the wafer inspection apparatus of the present invention, a connector for electrically connecting the circuit board for inspection to the circuit board for connection is the anisotropically conductive connector described above, whereby the electrical connection of the inspection electrodes of the circuit board for inspection to the terminal electrodes of the circuit board for connection is surely achieved under small pressurizing force, so that there is no need of using a large-scaled mechanism as the pressurizing mechanism. In addition, since a clearance between the circuit board for inspection and the circuit board for connection is short, the size of the wafer inspection apparatus in the height-wise direction can be made small. Accordingly, the wafer inspection apparatus can be miniaturized as a whole.

Since the pressurizing force applied to the inspection electrodes of the circuit board for inspection is small, the inspection electrodes are not damaged, so that the circuit board for inspection is prevented from shortening the service life thereof.

The inspection electrodes of the circuit board for inspection are electrically connected through the specific anisotropically conductive connector, whereby the inspection electrodes can be arranged at a high density. Accordingly, a great number of inspection electrodes can be formed, so that a great number of electrodes to be inspected can be inspected collectively.

In the electrical connection through the specific anisotropically conductive connector, contact resistance can be made low, and a stable connected state can be achieved, so that good electrical properties can be obtained.

Since the inspection electrodes of the circuit board for inspection are electrically connected to the terminal electrodes of the circuit board for connection through the specific anisotropically conductive connector, a distance of a signal transmission system can be made short, so that the wafer inspection apparatus can be adapted to electrical inspection as to high functional integrated circuits of which high-speed processing is required.

DESCRIPTION OF CHARACTERS

Figure 1:
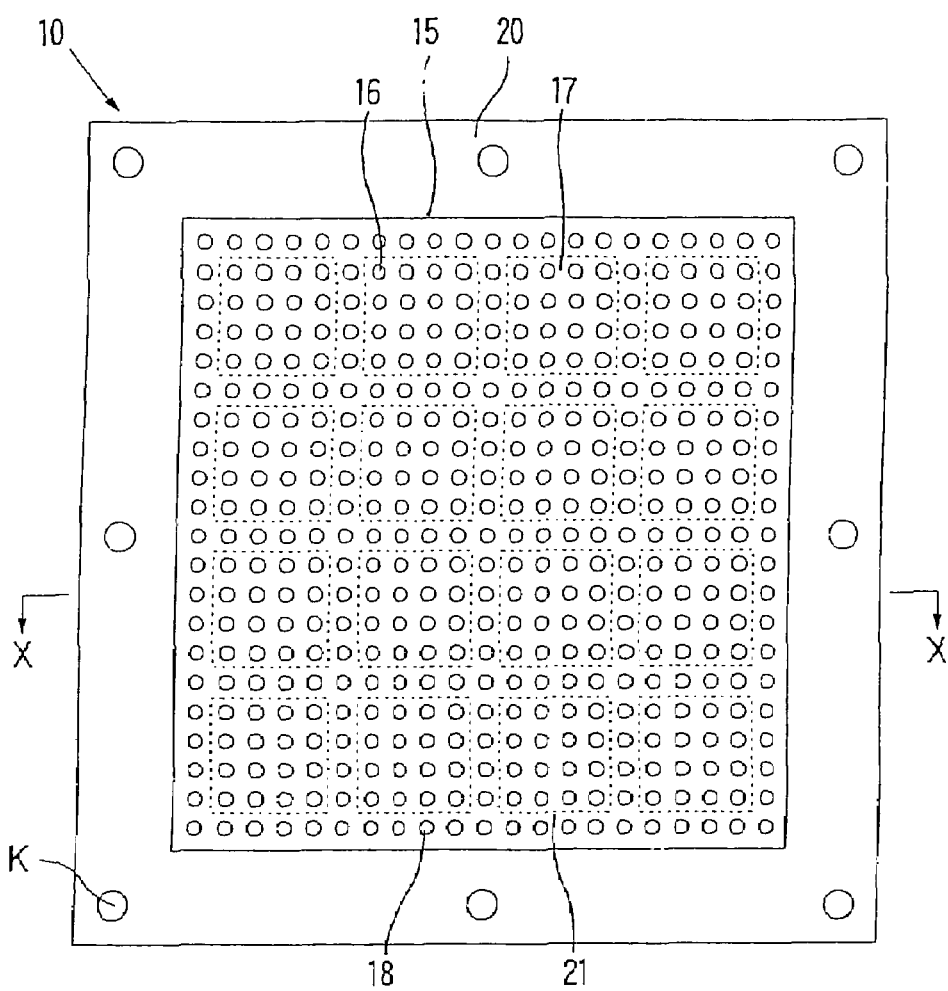
FIG. 1 is a plan view illustrating an exemplary anisotropically conductive connector according to the present invention.

1 Wafer
10 Anisotropically conductive connector
15 Elastic anisotropically conductive film
15A Molding material layer
16 Conductive parts for connection
16A, 16B Projected parts
17 Insulating part
18 Conductive parts for non-connection
20 Frame plate
21 Through-holes
22 Through-holes
30 Circuit board for inspection
31 Inspection electrodes
35 Pressurizing mechanism
36 Wafer tray
40 Probe card
41 Circuit board for connection
42 Terminal electrodes
43 Guide pins
44 Connecting electrodes
45 Contact member(s)
46a Beam parts
46b Contacts
47 Anisotropically conductive sheet
47a Conductive parts for connection
47b Insulating part
48 Sheet-like connector
48a Insulating sheet
49 Contacts
49a Front-surface electrodes
49b Back-surface electrodes
49c Short circuit part
50 Mold
51 Top force
52 Ferromagnetic base plate
53 Non-magnetic base plate
53A Magnetic member-receiving recesses
53B Projected part-forming recesses
54A Spherical magnetic members
54B Lid members
56 Bottom force
57 Ferromagnetic base plate
58 Non-magnetic base plate
58A Magnetic member-receiving recesses
58B Projected part-forming recesses
59A Spherical magnetic members
59B Lid members
60 Mold
61 Top force
62 Ferromagnetic base plate
63 Ferromagnetic substance layers
64 Non-magnetic substance layers
66 Bottom force
67 Ferromagnetic base plate
68 Ferromagnetic substance layers
69 Non-magnetic substance layers
80 Circuit board for inspection
81 Inspection electrodes
85 Connector
86 Connecting pins
90 Probe card
91 Circuit board for connection
92 Terminal electrodes
93 Guide pins
95 Contact member
96 Wafer tray
97 Pressurizing mechanism
K Positioning holes
P Conductive particles
100 One electrode plate for test
101 Patterned electrode
102 Leading electrodes
105 Other electrode plate for test
106 Common electrode
110 Voltmeter
115 DC power source
116 Constant-current controller
120 Spacer
121 Core
122 Coating layer

BEST MODE FOR CARRYING OUT THE INVENTION

The embodiments of the present invention will hereinafter be described in detail.

[Anisotropically Conductive Connector]

Figure 2:
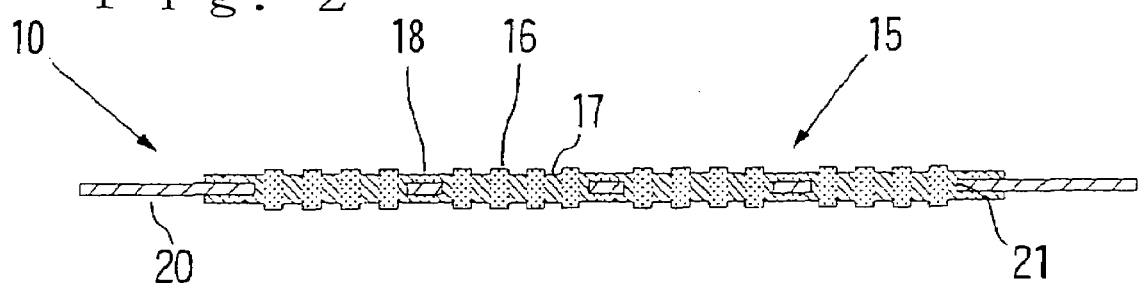
FIG. 2 is a cross-sectional view of the anisotropically conductive sheet taken along line X-X in FIG. 1.

FIG. 1 is a plan view illustrating an exemplary anisotropically conductive connector according to the present invention, and FIG. 2 is a cross-sectional view of the anisotropically conductive connector taken along line X-X in FIG. 1.

This anisotropically conductive connector 10 is constructed by an elastic anisotropically conductive film 15 exhibiting conductivity in a thickness-wise direction thereof and a rectangular frame plate 20 supporting this elastic anisotropically conductive film 15 and composed of a metallic material.

Figure 3:
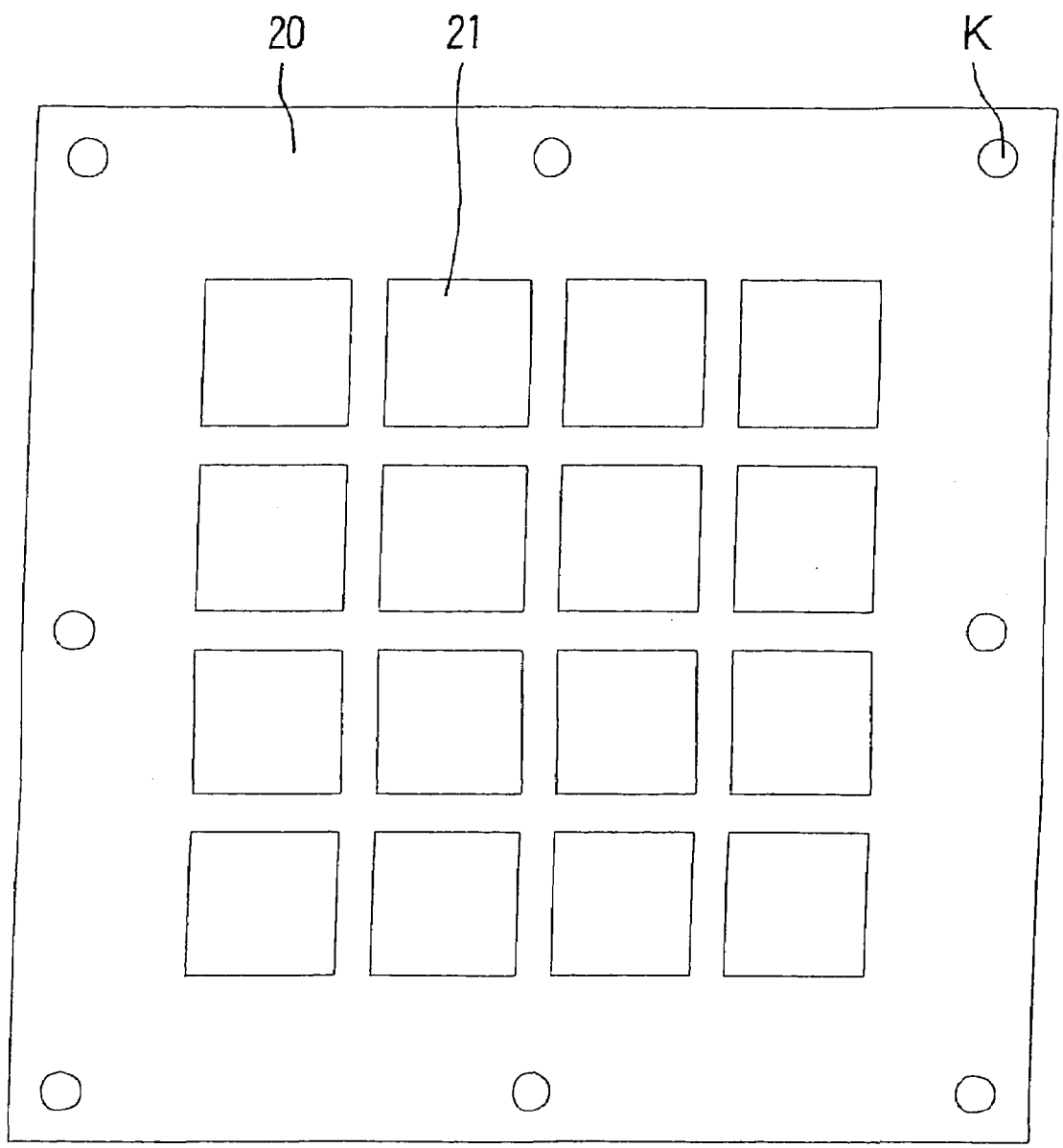
FIG. 3 is a plan view of a frame plate in the anisotropically conductive connector shown in FIG. 1.

As illustrated in FIG. 3, a plurality of through-holes 21 each extending in the thickness-wise direction and having a rectangular shape in section are formed in the frame plate 20 so as to align vertically and laterally. In the embodiment illustrated, a plurality of positioning holes K for positioning and arranging the anisotropically conductive connector 10 are formed in peripheral edge portions of the frame plate 20.

Figure 4:
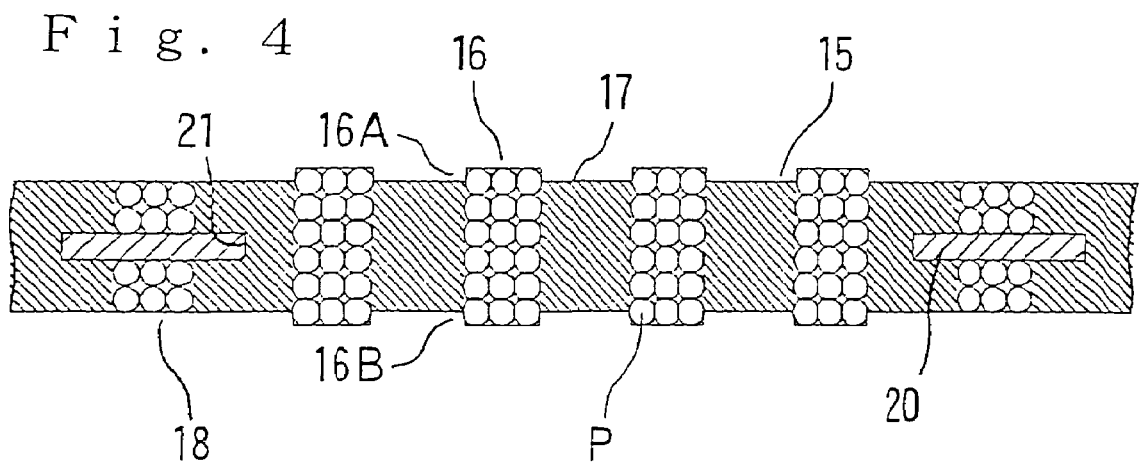
FIG. 4 is a cross-sectional view illustrating, on an enlarged scale, an elastic anisotropically conductive film in the anisotropically conductive connector shown in FIG. 1.

In the elastic anisotropically conductive film 15, a plurality of conductive parts 16 for connection each extending in the thickness-wise direction are arranged in a state separated from each other in a plane direction of the film in accordance with a pattern corresponding to a pattern of electrodes intended to be connected. Specifically, plural groups of conductive parts for connection, in each of which a plurality of the conductive parts 16 for connection are arranged in accordance with positions of lattice points of the same pattern, are arranged so as to align vertically and laterally. In this embodiment, a plurality of conductive parts 18 for non-connection each extending in the thickness-wise direction are arranged at other positions than positions, at which the groups of the conductive parts for connection are respectively arranged, in a state separated from each other in the plane direction at the same pitch as the conductive parts 16 for connection so as to surround all the groups of the conductive parts for connection. These conductive parts 16 for connection and conductive parts 18 for non-connection are mutually insulated by an insulating part 17 interposing among them. As illustrated on an enlarged scale in FIG. 4, each of the conductive parts 16 for connection and the conductive parts 18 for non-connection is formed by containing conductive particles P exhibiting magnetism in an insulating elastic polymeric substance at a high density in a state oriented in the thickness-wise direction, and the insulating part 17 is formed by the insulating elastic polymeric substance. In the embodiment illustrated, projected parts 16A and 16B respectively protruding from both surfaces of the insulating part 17 are formed at each of the conductive part 16 for connection.

The elastic anisotropically conductive film 15 is supported by being integrally fixed to the frame plate 20 in such a manner that the groups of the conductive parts for connection are located within the respective through-holes 21 in the frame plate 20, and each of the conductive parts 18 for non-connection are located on the frame plate 20.

The metallic material forming the frame plate 20 is preferably that having a coefficient of linear thermal expansion of $3 \times 10^{-6}$ to $2 \times 10^{-5}$ $K^{-1}$, preferably $3.5 \times 10^{-6}$ to $1.5 \times 10^{-5}$ $K^{-1}$.

If the coefficient of linear thermal expansion of this metallic material exceeds $2 \times 10^{-5}$ $K^{-1}$, it is difficult to stably retain a good electrically connected state because positional deviation between the conductive parts 16 for connection and electrodes intended to be connected occurs due to thermal expansion of the anisotropically conductive connector 10 when the temperature about the anisotropically conductive connector 10 is raised by heating a wafer in the case where the anisotropically conductive connector 10 is used as a connector in a wafer inspection apparatus which will be described subsequently.

Specific examples of the metallic material forming the frame plate 20 include invar, superinvar, Elinvar, cover, 42 alloy and stainless steel.

The thickness of the frame plate 20 is preferably 0.05 to 1 mm, more preferably 0.1 to 0.8 mm. If this thickness is less than 0.05 mm, a frame plate 20 having sufficiently high strength cannot be obtained. If this thickness exceeds 1 mm on the other hand, the thickness of the conductive parts 16 for connection in the resulting elastic anisotropically conductive film 15 becomes considerably great, and it is difficult to obtain conductive parts 16 for connection having good conductivity.

The elastic polymeric substance forming the conductive parts 16 for connection, conductive parts 18 for non-connection and insulating part 17 in the elastic anisotropically conductive film 15 is preferably that having a crosslinked structure. As a curable polymeric substance-forming material for obtaining such a crosslinked elastic polymeric substance, may be used various materials. Specific examples thereof include silicone rubber, conjugated diene rubbers such as polybutadiene rubber, natural rubber, polyisoprene rubber, styrene-butadiene copolymer rubber and acrylonitrile-butadiene copolymer-rubber, and hydrogenated products thereof; block copolymer rubbers such as styrene-butadiene-diene block copolymer rubber and styrene-isoprene block copolymers, and hydrogenated products thereof; and chloroprene, urethane rubber, polyester rubber, epichlorohydrin rubber, ethylene-propylene copolymer rubber, ethylene-propylene-diene copolymer rubber and soft liquid epoxy rubber.

Among these, silicone rubber is preferred from the viewpoints of molding and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

Among these, vinyl group-containing liquid silicone rubber (vinyl group-containing dimethyl polysiloxane) is generally obtained by subjecting dimethyldichlorosilane or dimethyldialkoxysilane to hydrolysis and condensation reaction in the presence of dimethylvinylchlorosilane or dimethylvinylalkoxysilane and successively fractionating the reaction product by, for example, repeated dissolution-precipitation.

Liquid silicone rubber having vinyl groups at both terminals thereof is obtained by subjecting a cyclic siloxane such as octamethylcyclotetrasiloxane to anionic polymerization in the presence of a catalyst, using, for example, dimethyldivinylsiloxane as a polymerization terminator and suitably selecting other reaction conditions (for example, amounts of the cyclic siloxane and polymerization terminator). As the catalyst for the anionic polymerization used herein, may be used an alkali such as tetramethylammonium hydroxide or n-butylphosphonium hydroxide or a silanolate solution thereof. The reaction is conducted at a temperature of, for example, 80 to 130° C.

Such a vinyl group-containing dimethyl polysiloxane preferably has a molecular weight Mw (weight average molecular weight as determined in terms of standard polystyrene equivalent; the same shall apply hereinafter) of 10,000 to 40,000. It also preferably has a molecular weight distribution index (a ratio Mw/Mn of weight average molecular weight Mw as determined in terms of standard polystyrene equivalent to number average molecular weight Mn as determined in terms of standard polystyrene equivalent; the same shall apply hereinafter) of at most 2 from the viewpoint of the heat resistance of the resulting anisotropically conductive film 15.

On the other hand, hydroxyl group-containing liquid silicone rubber (hydroxyl group-containing dimethyl polysiloxane) is generally obtained by subjecting dimethyldichlorosilane or dimethyldialkoxysilane to hydrolysis and condensation reaction in the presence of dimethylhydrochlorosilane or dimethylhydroalkoxysilane and successively fractionating the reaction product by, for example, repeated dissolution-precipitation.

The hydroxyl group-containing liquid silicone rubber is also obtained by subjecting a cyclic siloxane to anionic polymerization in the presence of a catalyst, using, for example, dimethylhydrochlorosilane, methyldihydrochlorosilane or dimethylhydroalkoxysilane as a polymerization terminator and suitably selecting other reaction conditions (for example, amounts of the cyclic siloxane and polymerization terminator). As the catalyst for the anionic polymerization used herein, may be used an alkali such as tetramethylammonium hydroxide or n-butylphosphonium hydroxide or a silanolate solution thereof. The reaction is conducted at a temperature of, for example, 80 to 130° C.

Such a hydroxyl group-containing dimethyl polysiloxane preferably has a molecular weight Mw of 10,000 to 40,000. It also preferably has a molecular weight distribution index of at most 2 from the viewpoint of the heat resistance of the resulting anisotropically conductive film 15.

In the present invention, either one of the above-described vinyl group-containing dimethyl polysiloxane and hydroxyl group-containing dimethyl polysiloxane may be used, or both may be used in combination.

A curing catalyst for curing the polymeric substance-forming material may be contained in the polymeric substance-forming material. As such a curing catalyst, may be used an organic peroxide, fatty acid azo compound, hydrosilylation catalyst or the like.

Specific examples of the organic peroxide used as the curing catalyst include benzoyl peroxide, bisdicyclobenzoyl peroxide, dicumyl peroxide and di-tert-butyl peroxide.

Specific examples of the fatty acid azo compound used as the curing catalyst include azobisisobutyronitrile.

Specific examples of that may be used as the catalyst for hydrosilylation reaction include publicly known catalysts such as platinic chloride and salts thereof, platinum-unsaturated group-containing siloxane complexes, vinylsiloxane-platinum complexes, platinum-1,3-divinyltetramethyldisiloxane complexes, complexes of triorganophosphine or phosphine and platinum, acetyl acetate platinum chelates, and cyclic diene-platinum complexes.

The amount of the curing catalyst used is suitably selected in view of the kind of the polymeric substance-forming material, the kind of the curing catalyst and other curing treatment conditions. However, it is generally 3 to 15 parts by mass per 100 parts by mass of the polymeric substance-forming material.

In the polymeric substance-forming material, may be contained an inorganic filler such as general silica powder, colloidal silica, aerogel silica or alumina as needed. By containing such an inorganic filler, the thixotropic property of the resulting molding material, which will be described subsequently, is ensured, the viscosity thereof becomes high, and moreover the dispersion stability of the conductive particles is improved, the strength of the elastic anisotropically conductive film 15 obtained by conducting a curing treatment can be made high.

No particular limitation is imposed on the amount of such an inorganic filler used. However, the use in a too large amount is not preferred because the orientation of the conductive particles P by a magnetic field cannot be sufficiently achieved in a production process, which will be described subsequently.

Figure 19:
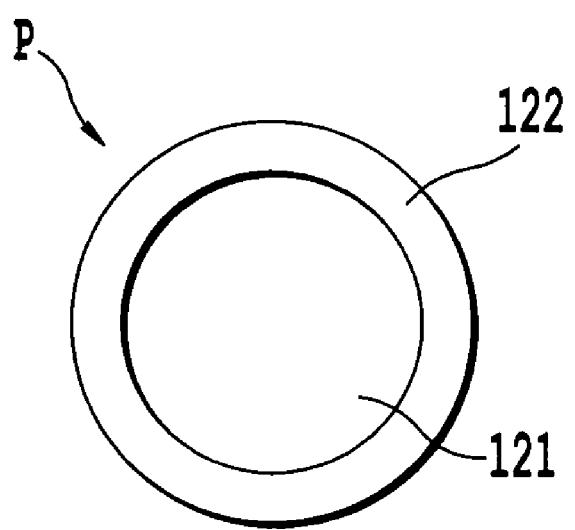
FIG. 19 illustrates a conductive particle having a core and a coating layer thereon.

The conductive particles P exhibiting magnetism, which form the conductive parts 16 for connection and conductive parts 18 for non-connection, are those obtained by forming a coating layer 122 composed of a noble metal on surfaces of core particles 121 exhibiting magnetism, as illustrated in FIG. 19.

As a material for forming the core particles, may be used that composed of a ferromagnetic metal such as iron, nickel, cobalt or an alloy thereof, that obtained by plating surfaces of inorganic particles such as non-magnetic metal particles or glass beads, or polymer particles with the ferromagnetic metal, or the like. As the noble metal forming the coating layer, may be used gold, silver, palladium, rhodium, iridium, an alloy thereof, or the like.

No particular limitation is imposed on the means for coating the surfaces of the core particles with the conductive metal, and the coating may be conducted by, for example, a wet process such as electroless plating, replacement plating or electroplating, or a dry process such as sputtering.

The thickness of the coating layer in the conductive particles P is at least 20 nm, preferably at least 30 nm, more preferably at least 50 nm. When the thickness of the coating layer is at least 20 nm, the conductivity of such conductive particles becomes sufficiently high, so that conductive parts for connection having high conductivity in the thickness-wise direction can be surely obtained. In the present invention, the thickness of the coating layer of the conductive particles means that calculated out in accordance with the following expression (I).

$$t = [1/(Sw \cdot \rho)] \times [N/(1-N)] \qquad \text{Expression (I)}$$

wherein t is the thickness (m) of the coating layer, Sw is a BET specific surface area ($m^2$/kg) of the core particles, $\rho$ is a specific gravity (kg/$m^3$) of the noble metal forming the coating layer, and N is a coating rate (weight of the coating layer/weight of the conductive particles) by the coating layer.

The expression (I) is derived in the following manner.

(a) Supposing that the weight of the core particles is Mp (kg), the surface area S ($m^2$) of the core particles is found by an equation (1):

$$S = Sw \cdot Mp \qquad (1)$$

(b) Supposing that the weight of the coating layer is m (kg), the volume V ($m^3$) of the coating layer is found by an equation:

$$V = m/\rho \qquad (2)$$

(c) Assuming that the thickness of the coating layer is even over all surfaces of the conductive particles, t=V/S. When the above-described equations (1) and (2) are substituted into this equation, the thickness of the coating layer is determined by an equation:

$$t = (m/\rho)/(Sw \cdot Mp) = m/(Sw \cdot \rho \cdot Mp) \qquad (3)$$

(d) Since the coating rate N by the coating layer is a ratio of the weight of the coating layer to the weight of the conductive particles, the coating rate N is found by an equation:

$$N=m/(Mp+m) \quad (4)$$

(e) When the numerator·denominator in the right-hand side of the equation (4) is divided by Mp, N=(m/MP)/(1+m/Mp) is given. When both sides are multiplied by (1+m/Mp), and the product is N(1+m/Mp)=m/Mp, further N+N(m/Mp)=m/Mp. When N(m/Mp) is transposed into the right-hand side, N=m/Mp−N(m/Mp)=(m/Mp)(1−N) is given. Both sides are divided by (1−N) and N/(1−N)=m/Mp is given. Accordingly, the weight Mp of the core particles is determined by an equation:

$$Mp=m/[N/(1-N)]=m(1-N)/N \quad (5)$$

(f) When the equation (5) is substituted into the equation (3), t=1/[Sw·ρ·(1−N)/N]=[1/(Sw·ρ)]×[N/(1−N)] is driven.

The coating rate N by the coating layer is preferably 2.5 to 50% by mass, more preferably 3 to 30% by mass, still more preferably 3.5 to 25% by mass, particularly preferably 4 to 20% by mass. When the coating noble metal is gold, the coating rate thereof is preferably 3 to 30% by mass, more preferably 3.5 to 25% by mass, still more preferably 4 to 20% by mass, particularly preferably 4.5 to 10% by mass.

The number average particle diameter of the conductive particles P is 20 to 80 μm, preferably 30 to 60 μm, more preferably 35 to 50 μm.

If the number average particle diameter of the conductive particles P is smaller than 20 μm, the sum total of contact resistance among such conductive particles becomes considerably high because the number of contact points among the conductive particles in conductive paths formed in the conductive parts for connection is increased, so that high conductivity cannot be achieved in the thickness-wise direction. If the number average particle diameter of the conductive particles P exceeds 80 μm on the other hand, variations in conductivity tends to occur among the conductive parts for connection, and the hardness of the conductive parts for connection is liable to be high because the number of such conductive particles contained in the conductive parts for connection is reduced, so that stable electrical connection to electrodes intended to be connected cannot be achieved.

The water content in the conductive particles P is preferably at most 5%, more preferably at most 3%, still more preferably at most 2%, particularly preferably at most 1%. The use of the conductive particles P satisfying such conditions can prevent or inhibit the occurrence of bubbles in a molding material layer upon a curing treatment of the molding material layer in the production process which will be described subsequently.

Those obtained by treating surfaces of the conductive particles P with a coupling agent such as a silane coupling agent may be suitably used. By treating the surfaces of the conductive particles with the coupling agent, the adhesion property of the conductive particles P to the elastic polymeric substance is improved, so that the resulting conductive parts 16 for connection become high in durability in repeated use.

The amount of the coupling agent used is suitably selected within limits not affecting the conductivity of the conductive particles P. However, it is preferably such an amount that a coating rate (proportion of an area coated with the coupling agent to the surface area of the conductive core particles) of the coupling agent on the surfaces of the conductive particles P amounts to at least 5%, more preferably 7 to 100%, further preferably 10 to 100%, particularly preferably 20 to 100%.

Such conductive particles P are preferably contained in a proportion of 15 to 50%, more preferably 20 to 40% in terms of volume fraction in the conductive parts 16 for connection. If this proportion is lower than 15%, conductive parts 16 for connection sufficiently low in electric resistance value may not be obtained in some cases. If the proportion exceeds 50% on the other hand, the resulting conductive parts for connection are liable to be brittle, so that elasticity required of the conductive parts for connection may not be achieved in some cases.

The durometer hardness of each of the conductive parts 16 for connection is controlled to 10 to 35, preferably 20 to 30. If this durometer hardness is lower than 10, it is difficult to retain a good electrically connected state because great permanent set is caused in the conductive parts 16 for connection when the conductive parts 16 for connection are held for a long period of time under a high-temperature environment in a pressurized state. If this durometer hardness exceeds 35 on the other hand, a conductive path low in electric resistance is not formed in each of the conductive parts for connection because the conductive parts 16 for connection are not sufficiently deformed under small pressurizing force. As a result, it is difficult to achieve a stable electrically connected state.

In the present invention, the term "durometer hardness" means that measured by means of a Type A durometer on the basis of the durometer hardness test prescribed in JIS K 6253.

An electric resistance between conductive parts 16 for connection adjoining each other is at least 10 MΩ, preferably at least 20 MΩ. If this electric resistance is lower than 10 MΩ, reliability on connection to electrodes intended to be connected becomes low.

The allowable current value of each of the conductive parts 16 for connection when the conductive part 16 for connection is pressurized in the thickness-wise direction thereof under a load of 20 g is preferably at least 1 A.

The allowable current value of each of the conductive parts 16 for connection when the conductive part 16 for connection is pressurized in the thickness-wise direction thereof so as to give a distortion factor of 20% is preferably at least 1 A.

The term "allowable current value of the conductive part for connection" as used in the present invention means a maximum current value that the electric resistance in the conductive part for connection does not exceed 0.1 Ω after a current is applied to the conductive part for connection for 20 seconds in a state that the conductive part for connection has been pressurized in the thickness-wise direction under a room-temperature environment.

If the allowable current value is too small, the conductive part 16 for connection generates heat when a current of a value necessary for electrical inspection is applied to the conductive part 16 for connection in the case where such an anisotropically conductive connector 10 is used in the inspection of, for example, a wafer, so that the anisotropically conductive connector 10 tends to cause some trouble in its early state to fail to achieve a long service life. Therefore, an operation for replacing the failed anisotropically conductive connector 10 by a new one must be frequently conducted to incur the reduction of inspection efficiency.

In the anisotropically conductive connector according to the present invention, an electric resistance (hereinafter also referred to as "electric resistance $R_a$") of each of the conductive parts for connection in the thickness-wise direction as measured in a state that the conductive part for connection has been pressurized under a load of 20 g in the thickness-wise direction is preferably at most 0.1 Ω, more preferably at most 0.08 Ω.

If this electric resistance $R_a$ exceeds 0.1 Ω, the conductive part 16 for connection generates heat when a current of a value necessary for electrical inspection is applied to the conductive part 16 for connection in the case where such an anisotropically conductive connector 10 is used in the inspection of, for example, a wafer, so that the anisotropically conductive connector tends to cause some trouble to fail to achieve a long service life. Therefore, an operation for replacing the failed anisotropically conductive connector 10 by a new one must be frequently conducted to incur the reduction of inspection efficiency.

Further, an electric resistance (hereinafter also referred to as "electric resistance $R_b$") of each of the conductive parts for connection in the thickness-wise direction thereof as measured in a state that the conductive part for connection has been pressurized in the thickness-wise direction under a load of 20 g after a cycle that the conductive part for connection is pressurized for 15 minutes in the thickness-wise direction under a load of 20 g in an environment of 80° C. in temperature, and the conductive part for connection is then held for 5 minutes in an unloaded state was repeated 3,000 times is preferably at most 0.1 Ω, more preferably at most 0.08 Ω.

If this electric resistance $R_b$ exceeds 0.1 Ω, the conductive part 16 for connection generates heat when a current of a value necessary for electrical inspection is applied to the conductive part 16 for connection in the case where such an anisotropically conductive connector 10 is used in the inspection of, for example, a wafer, so that the anisotropically conductive connector 10 tends to cause some trouble to fail to achieve a long service life. Therefore, an operation for replacing the failed anisotropically conductive connector 10 by a new one must be frequently conducted to incur the reduction of inspection efficiency.

In addition, an electric resistance (hereinafter also referred to as "electric resistance $R_c$") of each of the conductive parts for connection in the thickness-wise direction thereof as measured in a state that the conductive part for connection has been pressurized in the thickness-wise direction so as to give a distortion factor of 20% is preferably at most 0.1 Ω, more preferably 0.08 Ω.

If this electric resistance $R_c$ exceeds 0.1 Ω, the conductive part 16 for connection generates heat when a current of a value necessary for electrical inspection is applied to the conductive part 16 for connection in the case where such an anisotropically conductive connector 10 is used in the inspection of, for example, a wafer, so that the anisotropically conductive connector 10 tends to cause some trouble to fail to achieve a long service life. Therefore, an operation for replacing the failed anisotropically conductive connector 10 by a new one must be frequently conducted to incur the reduction of inspection efficiency.

Further, an electric resistance (hereinafter also referred to as "electric resistance $R_d$") of each of the conductive parts for connection in the thickness-wise direction thereof as measured after a current of 1 A is applied to the conductive part for connection for 3,000 hours in a state that the conductive part for connection had been pressurized in the thickness-wise direction in an environment of 80° C. in temperature so as to give a distortion factor of 20% is preferably at most 0.1 Ω, more preferably at most 0.08 Ω.

If this electric resistance $R_d$ exceeds 0.1 Ω, the conductive part 16 for connection generates heat when a current of a value necessary for electrical inspection is applied to the conductive part 16 for connection in the case where such an anisotropically conductive connector 10 is used in the inspection of, for example, a wafer, so that the anisotropically conductive connector 10 tends to cause some trouble to fail to achieve a long service life. Therefore, an operation for replacing the failed anisotropically conductive connector 10 by a new one must be frequently conducted to incur the reduction of inspection efficiency.

A coefficient of variation of each of the electric resistances $R_a$, $R_b$, $R_c$ and $R_d$ as to all the conductive parts for connection of the anisotropically conductive connector 10 is preferably at most 50%. If this coefficient of variation exceeds 50%, variations in conductivity between the conductive parts for connection in such an anisotropically conductive connector become great, so that high reliability on connection may not be achieved in some cases.

The overall thickness (thickness of each conductive part 16 for connection in the illustrated embodiment) of the elastic anisotropically conductive film 15 is preferably 0.2 to 1.5 mm, more preferably 0.3 to 1.0 mm. When this thickness is not smaller than 0.2 mm, an elastic anisotropically conductive film 15 having sufficient strength is obtained with certainty. When this thickness is not greater than 1.5 mm on the other hand, conductive parts 16 for connection having necessary conductivity are obtained with certainty.

The total projected height of the projected parts 16A and 16B in each conductive part 16 for connection is preferably at least 20% of the thickness of such a conductive part 16 for connection, more preferably at least 25%. Projected parts 16A and 16B having such a projected height are formed, whereby the conductive parts 16 for connection are sufficiently compressed by a small pressure, so that good conductivity is surely obtained.

Such an anisotropically conductive connector 10 can be produced, for example, in the following manner.

A frame plate 20 as illustrated in FIG. 3 is first produced. As a method for forming the through-hole 21 in the frame plate 20 in this process, may be used a method making a use of a die, a physical working method such as a punching working, drilling working, rooter working or laser beam machining method, or a chemical working method such as a chemical etching method.

Figure 5:
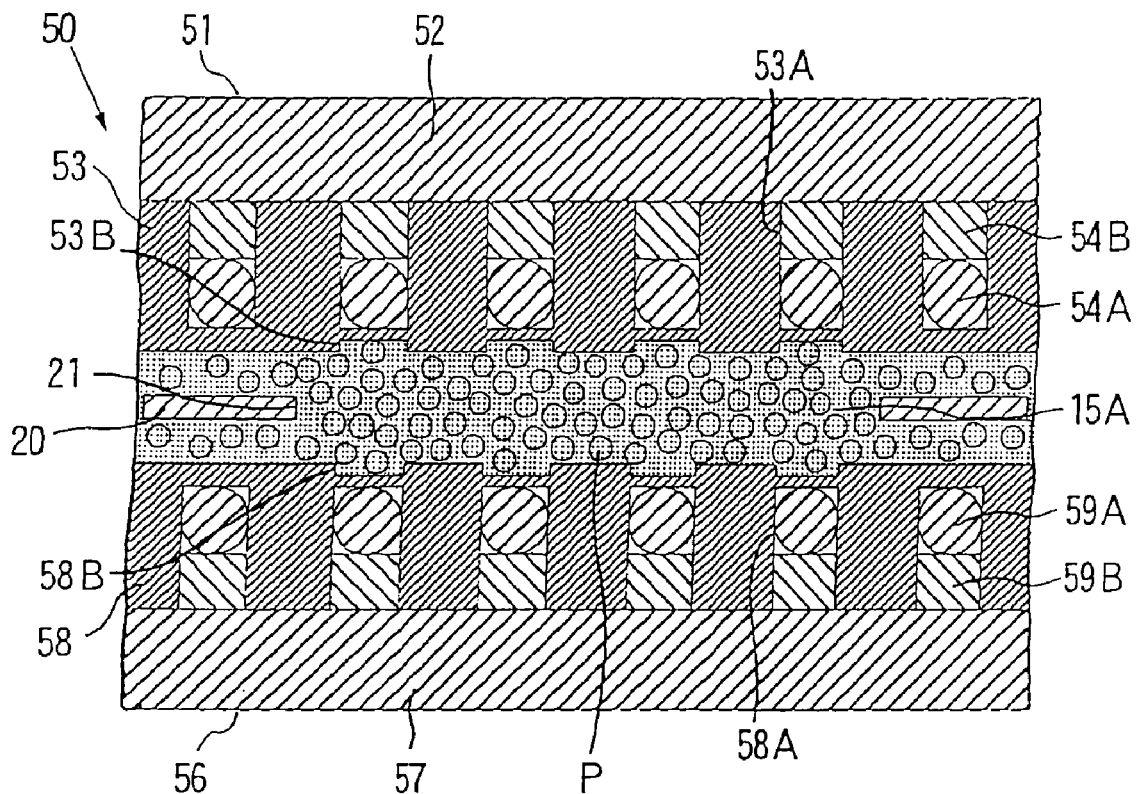
FIG. 5 is a cross-sectional view illustrating the construction of an exemplary mold for molding an elastic anisotropically conductive film.

A flowable molding material with conductive particles exhibiting magnetism dispersed in a liquid polymeric substance-forming material, which will become an insulating elastic polymeric substance by a curing treatment, is then prepared. A mold 50 for molding an elastic anisotropically conductive film is provided as illustrated in FIG. 5, the frame plate 20 is arranged in alignment on an upper surface of a bottom force 56 of the mold 50 through a spacer (not illustrated), a top force 51 is arranged in alignment on the frame plate 20 through a spacer (not illustrated), and the molding material prepared as above is filled in a molding cavity formed by the top force 51, the bottom force 56, the spacers and the frame plate 20 to form a molding material layer 15A.

The mold 50 will be described. In the top force 51, a non-magnetic base plate 53 is arranged by fixing it to a lower surface of a ferromagnetic base plate 52 by, for example, a screw mechanism (not illustrated). In an upper surface of the non-magnetic base plate 53, a great number of magnetic member-receiving recesses 53A, in which magnetic members 54A, which will be described subsequently, are respectively received, are formed in accordance with a pattern antipodal to an arrangement pattern of conductive parts 16 for connection and conductive parts 18 for non-connection of an elastic anisotropically conductive film 15 to be formed, and in a lower surface of the non-magnetic base plate 53, projected part-forming recesses 53B for forming respective projected parts 16A of the conductive parts 16 for connection are formed in accordance with a pattern antipodal to an arrangement pattern of the conductive parts 16 for connection of the elastic anisotropically conductive film 15 to be formed. Within the magnetic member-receiving recesses 53A in the non-magnetic base plate 53, spherical magnetic members 54A having a diameter conforming to a diameter of each magnetic member-receiving recesses 53A are respectively received, and a columnar lid member 54B for fixing the magnetic member 54A within the magnetic member-receiving recess 53A is provided so as to close the opening of each of the magnetic member-receiving recesses 53A.

In the bottom force 56 on the other hand, a non-magnetic base plate 58 is arranged by fixing it to an upper surface of a ferromagnetic base plate 57 by, for example, a screw mechanism (not illustrated). In a lower surface of the non-magnetic base plate 58, a great number of magnetic member-receiving recesses 58A, in which magnetic members 59A are respectively received, are formed in accordance with the same pattern as the arrangement pattern of the conductive parts 16 for connection and conductive parts 18 for non-connection of the elastic anisotropically conductive film 15 to be formed, and in an upper surface of the non-magnetic base plate 58, projected part-forming recesses 58B for forming respective projected parts 16B of the conductive parts 16 for connection are formed in accordance with the same pattern as an arrangement pattern of the conductive parts 16 for connection of the elastic anisotropically conductive film 15 to be formed. Within the magnetic member-receiving recesses 58A in the non-magnetic base plate 58, spherical magnetic members 59A having a diameter conforming to a diameter of each magnetic member-receiving recesses 58A are respectively received, and a columnar lid member 59B for fixing the magnetic member 59A within the magnetic member-receiving recess 58A is provided so as to close the opening of each of the magnetic member-receiving recesses 58A.

As a material for forming the ferromagnetic base plates 52 and 57 and the magnetic members 54A and 59A in both top force 51 and bottom force 56, may be used iron, nickel, cobalt, an alloy of these metals, or the like.

As a material for forming the non-magnetic base plates 53 and 58 in both top force 51 and bottom force 56, may be used copper, a copper alloy such as brass, aluminum, an aluminum alloy such as duralmin, or the like.

As a material for forming the lid members 54B and 59B, may preferably be used a ferromagnetic substance material. As specific examples thereof, may be mentioned iron, nickel, cobalt and alloys thereof.

Figure 6:
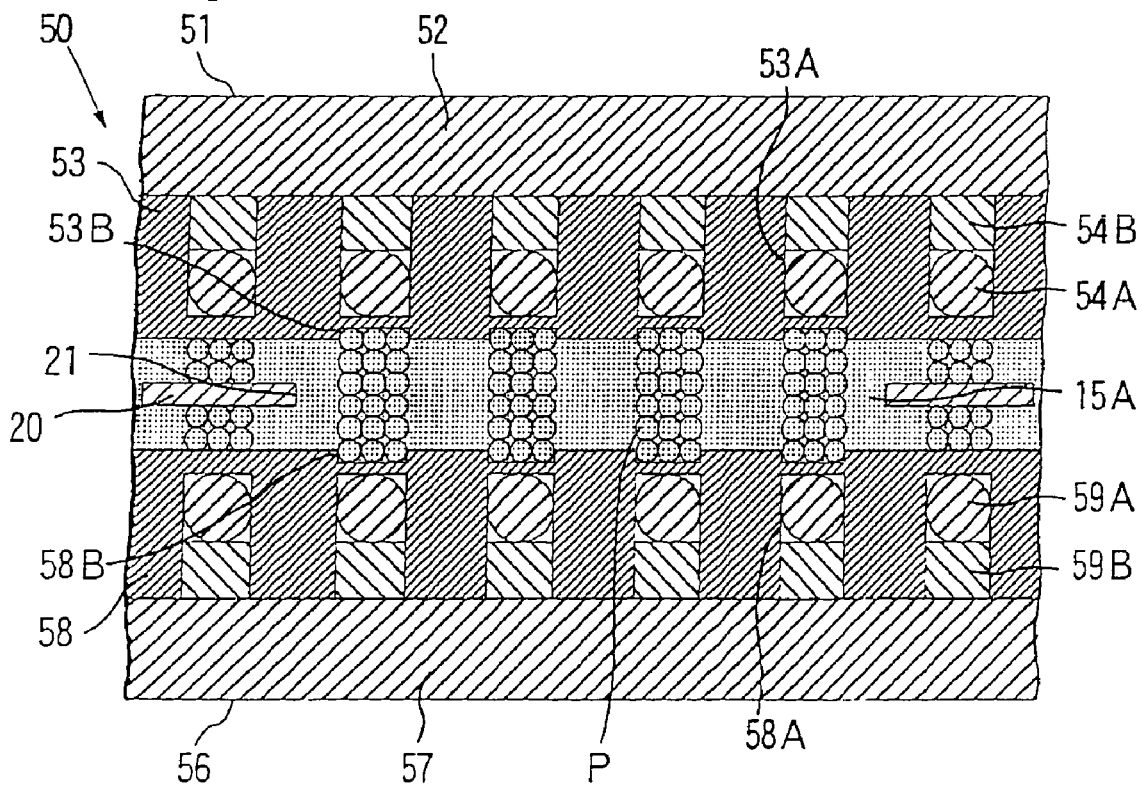
FIG. 6 is a cross-sectional view illustrating a state that a parallel magnetic field having intensity distribution has been applied to a molding material layer formed in the mold.

Electromagnets or permanent magnets are then arranged on the upper surface of the ferromagnetic base plate 52 in the top force 51 and the lower surface of the ferromagnetic base plate 57 in the bottom force 56 to apply a parallel magnetic field having strength distribution, i.e., a parallel magnetic field having higher intensity at portions between the magnetic members 54A in the top force 51 and their corresponding magnetic members 59A in the bottom force 56 to the molding material layer 15A in a thickness-wise direction thereof. As a result, in the molding material layer 15A, as illustrated in FIG. 6, the conductive particles P dispersed in the molding material layer 15A are gathered at portions located between the magnetic members 54A in the top force 51 and their corresponding magnetic members 59A in the bottom force 56 and oriented so as to align in the thickness-wise direction.

In this state, the molding material layer 15A is subjected to a curing treatment, whereby the elastic anisotropically conductive film 15 composed of the conductive parts 16 for connection and conductive parts 18 for non-connection arranged between the magnetic members 54A in the top force 51 and their corresponding magnetic members 59A in the bottom force 56 and containing the conductive particles P at a high density, and an insulating part 17, which interposes between these conductive parts 16 for connection and conductive parts 18 for non-connection, and in which the conductive particles P are not present at all or scarcely present, is formed in a state fixed and supported by the frame plate 20, thereby producing an anisotropically conductive connector 10.

In the above-described production process, the intensity of the parallel magnetic field applied to the molding material layer 15A is preferably an intensity that it amounts to 0.02 to 2.0 T on the average between the magnetic members 54A in the top force 51 and their corresponding magnetic members 59A in the bottom force 56.

The curing treatment of the molding material layer 15A may be conducted in a state that the parallel magnetic field has beep applied as it is. However, the treatment may also be conducted after the application of the parallel magnetic field is stopped.

The curing treatment of the molding material layer 15A is suitably selected according to the material used. However, the treatment is generally conducted by a heating treatment. Specific heating temperature and heating time are suitably selected in view of the kinds of the polymeric substance-forming material making up the molding material layer 15A, and the like, the time required for movement of the conductive particles P, and the like.

Figure 7:
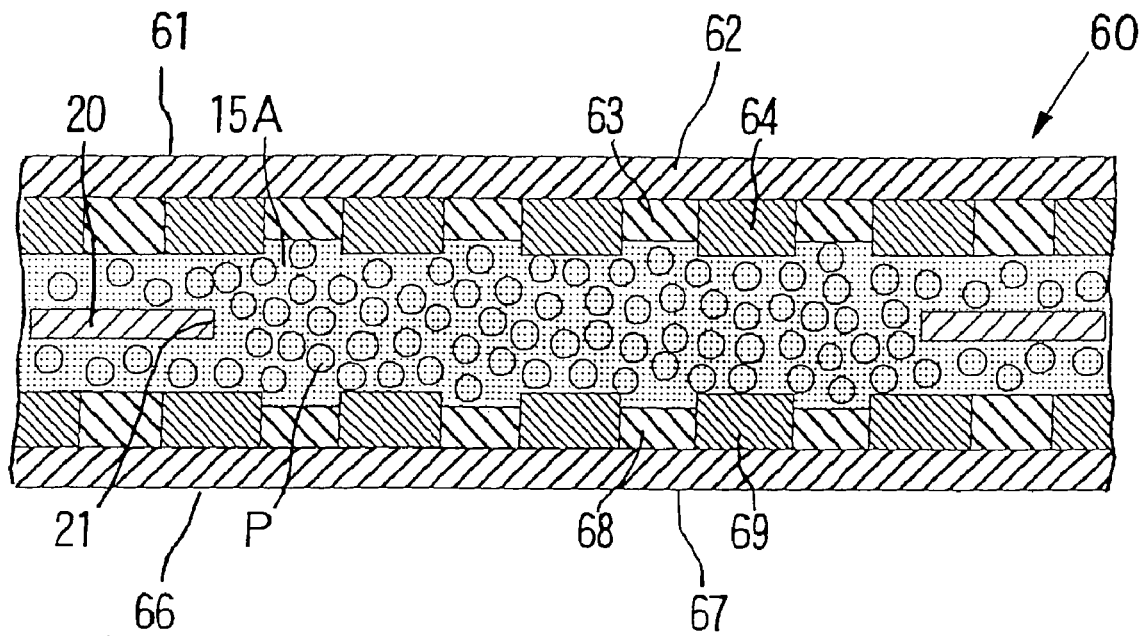
FIG. 7 is a cross-sectional view illustrating the construction of another exemplary mold for molding an elastic anisotropically conductive film.

A mold 60 illustrated in FIG. 7 may be used as a mold for molding the elastic anisotropically conductive film 15 in place of the mold 50 illustrated in FIG. 5.

This mold 60 will be described specifically. The mold 60 is constructed by arranging a top force 61 and a bottom force 66 so as to be opposed to each other.

In the top force 61, ferromagnetic substance layers 63 are formed on a lower surface of a ferromagnetic base plate 62 in accordance with a pattern antipodal to an arrangement pattern of conductive parts 16 for connection and conductive parts 18 for non-connection of the intended elastic anisotropically conductive film 15, and non-magnetic substance layers 64 having a thickness greater than that of the ferromagnetic substance layers 63 are formed at other areas than the ferromagnetic substance layers 63.

In the bottom force 66 on the other hand, ferromagnetic substance layers 68 are formed on an upper surface of a ferromagnetic base plate 67 in accordance with the same pattern as the arrangement pattern of the conductive parts 16 for connection and conductive parts 18 for non-connection of the intended elastic anisotropically conductive film 15, and non-magnetic substance layers 69 having a thickness greater than that of the ferromagnetic substance layers 68 are formed at other areas than the ferromagnetic substance layers 68.

As a material for forming the ferromagnetic base plates 62 and 67 and the ferromagnetic substance layers 63 and 68 in both top force 61 and bottom force 66, may be used iron, nickel, cobalt, an alloy of these metals, or the like.

As a material for forming the non-magnetic substance layers 64 and 69 in both top force 61 and bottom force 66, may be used a non-magnetic metal such as copper, a heat-resistant resin such as polyimide, a radiation-curable resin, or the like.

According to such an anisotropically conductive connector 10 as described above, the elastic anisotropically conductive film 15 is supported by the frame plate 20 formed of a metallic material, so that the whole of the anisotropically conductive connector 10 is not greatly deformed when the frame plate 20 is held, whereby a positioning operation of the anisotropically conductive connector 10 to electrodes intended to be connected, for example, inspection electrodes of a circuit board for inspection or terminal electrodes of a circuit board for connection, can be conducted with ease.

Since the metallic material forming the frame plate 20 has a low coefficient of linear thermal expansion, the frame plate 20 has excellent dimensional stability even in changes of temperature environment, whereby a good electrically connected state can be stably retained.

Since the specific conductive particles P are filled in the conductive parts 16 for connection in the elastic anisotropically conductive film 15, and the durometer hardness of the elastic polymeric substance making up the conductive parts 16 for connection falls within the specific range, high conductivity is achieved, and moreover a stable electrically connected state to electrodes intended to be connected is achieved.

Since the electric resistance between the conductive parts 16 for connection is at least 10 MΩ, high reliability on connection to electrodes intended to be connected is achieved.

[Wafer Inspection Apparatus]

Figure 8:
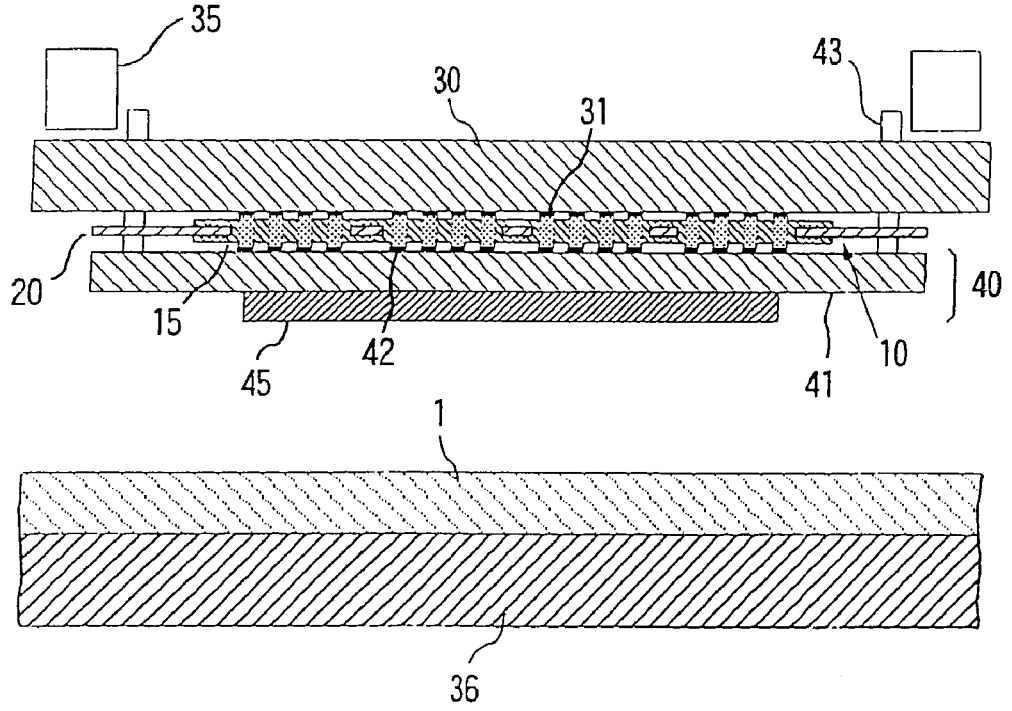
FIG. 8 is a cross-sectional view illustrating the construction of an exemplary wafer inspection apparatus according to the present invention.

FIG. 8 is a cross-sectional view illustrating the construction of an exemplary wafer inspection apparatus according to the present invention. This wafer inspection apparatus serves to conduct the WLBI test or probe test as to a wafer on which a great number of integrated circuits have been formed.

This wafer inspection apparatus has a circuit board 30 for inspection, on the front surface (lower surface in the figure) of which a great number of inspection electrodes 31 have been formed, and a probe card 40 is arranged on the front surface of this circuit board 30 for inspection through the anisotropically conductive connector 10 illustrated in FIGS. 1 and 2. In addition, a pressurizing mechanism 35 for pressurizing the circuit board for inspection downward is provided over the circuit board 30 for inspection.

The probe card 40 is constructed by a circuit board 41 for connection and a contact member 45 provided on a front surface (lower surface in the figure) of the circuit board 41 for connection and having a great number of contacts (not illustrated) brought into contact with electrodes (not illustrated) to be inspected of the integrated circuits in the wafer 1 that is an object of inspection. A wafer tray 36 combined with a heating plate, on which the wafer 1 that is the object of inspection is mounted, is arranged under the contact member 45.

Figure 9:
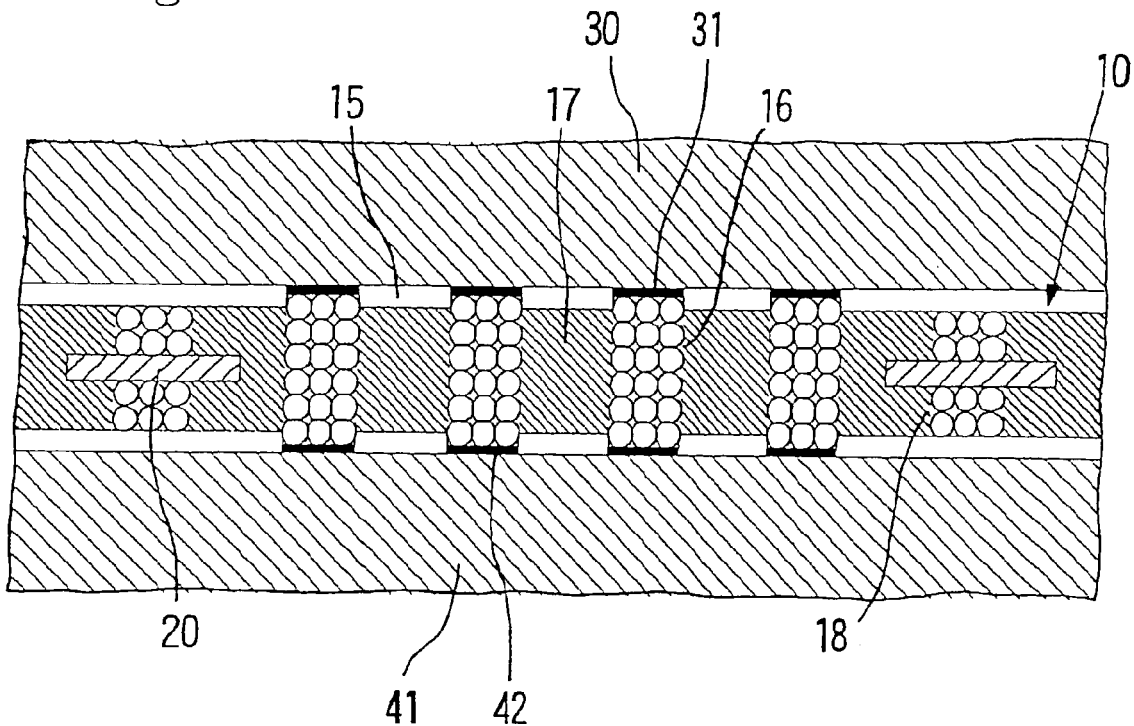
FIG. 9 is a cross-sectional view illustrating a connected state between a circuit board for inspection and a circuit board for connection in the wafer inspection apparatus shown in FIG. 8.

As illustrated on an enlarged scale in FIG. 9 as well, a great number of terminal electrodes 42 are formed on a back surface of the circuit board 41 for connection in the prove card 40 in accordance with a pattern corresponding to a pattern of the inspection electrodes 31 of the circuit board 30 for connection, and the circuit board 41 for connection is arranged in a state positioned by guide pins 43 in such a manner that the terminal electrodes 42 are respectively opposed to the inspection electrodes 31 of the circuit board 30 for inspection.

A plurality of the conductive parts 16 for connection are formed in the elastic anisotropically conductive film 15 in the anisotropically conductive connector 10 in accordance with the pattern corresponding to the pattern of the inspection electrodes 31 of the circuit board 30 for inspection. The anisotropically conductive connector 10 is arranged in a state positioned by the guide pins 43 in such a manner that the conductive parts 16 for connection in the elastic anisotropically conductive film 15 are respectively located between the inspection electrodes 31 of the circuit board 30 for inspection and the terminal electrodes 42 of the circuit board 41 for connection.

In the wafer inspection apparatus of this embodiment, the three of the circuit board 30 for inspection, the anisotropically conductive connector 10 and the circuit board 41 for connection are fixed in a state that the elastic anisotropically conductive film 15 in the anisotropically conductive connector 10 has been held and pressurized by the circuit board 30 for inspection and the circuit board 41 for connection, thereby the inspection electrodes 31 in the circuit board 30 for inspection to their corresponding terminal electrodes 42 in the circuit board 41 for connection are electrically connected through the conductive parts 16 for connection in the anisotropically conductive connector 10.

In this embodiment, the elastic anisotropically conductive film 15 in the anisotropically conductive connector 10 is preferably held and pressurized in a state that the electric resistance value of each of the conductive parts 16 for connection of the elastic anisotropically conductive film 15 is at most 0.1 Ω. Specifically, the pressurizing force against the elastic anisotropically conductive film 15 by the circuit board 30 for inspection and the circuit board 41 for connection is preferably force of 0.03 to 0.4 N per one conductive part 16 for connection. If this value is too small, variations in the electric resistance value of the conductive part 16 for connection are easy to occur, and the electric resistance value of the conductive part 16 for connection becomes high, so that it may be difficult in some cases to conduct necessary electrical inspection. If this value is too great on the other hand, the circuit board 30 for inspection and the circuit board 41 for connection are deformed, so that it may be difficult in some cases to achieve stable electrical connection.

In order to control the pressurizing force against the elastic anisotropically conductive film 15, a spacer may be provided between the circuit board 30 for inspection and the circuit board 41 for connection.

Means for fixing the circuit board 30 for inspection, the anisotropically conductive connector 10 and the circuit board 41 for connection include a means by screws, a means that bolts are used as the guide pins 43 to fix them by nuts, and the like.

The pitch of the inspection electrodes 31 in the circuit board 30 for inspection is preferably 0.5 to 5 mm, more preferably 1 to 2 mm. The inspection electrodes 31 are formed at such a pitch, whereby necessary electrical connection between the inspection electrodes 31 and their corresponding terminal electrodes 42 of the circuit board 41 for connection can be surely achieved, and moreover the inspection electrodes 31 can be arranged at a high density. Accordingly, a great number of inspection electrodes 31 according to electrodes to be inspected in the wafer 1 that is the object of inspection can be formed.

Each of the contacts of the contact member 45 in the probe card 40 is electrically connected to its corresponding inspection electrode 31 of the circuit board 30 for inspection through a circuit in the circuit board 41 for connection.

No particular limitation is imposed on the contact member 45, and those of various structures may be adopted. For example, that in which contacts each composed of a blade or pin and a microspring pin are arranged, that in which the contacts are composed of an anisotropically conductive sheet, that composed of a sheet-like connector, in which contacts each composed of a metallic body and extending through an insulating sheet in a thickness-wise direction thereof have been arranged in the insulating sheet, that obtained by laminating an anisotropically conductive sheet and a sheet-like connector, or the like may be used.

Specific examples of a probe card suitably usable in the wafer inspection apparatus according to the present invention will hereinafter be described.

Figure 10:
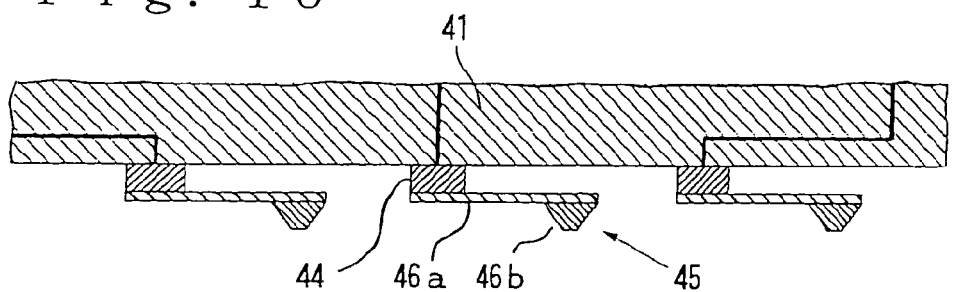
FIG. 10 is a cross-sectional view illustrating the construction of a principal part of an exemplary probe card used in the wafer inspection apparatus according to the present invention.

FIG. 10 is a cross-sectional view illustrating the construction of a principal part of an exemplary probe card. In this probe card, a plurality of projected connecting electrodes 44 are formed on the front surface of the circuit board 41 for connection in accordance with a proper pattern, and a contact member 45 is provided at the tip of each of these connecting electrodes 44. Each of the contact member 45 is formed by a beam part 46a composed of a plate spring and a contact 46a formed at an end of this beam part 46a. In the illustrated embodiment, the contact 46b is formed into a circular truncated cone or truncated pyramid. However, the form of the contact is not limited to these shapes, and the contact may be formed into a circular cone or pyramid. The contact 46b formed at an end of the beam part 46a in the contact member 45 is arranged in accordance with a pattern corresponding to a pattern of electrodes to be inspected of a wafer that is an object of inspection, and the other end of the beam part 46a is fixed to the tip of the connecting electrode 44.

Such a probe card and a production process thereof are described in, for example, Japanese Patent Application Laid-Open No. 2003-215161.

Figure 11:
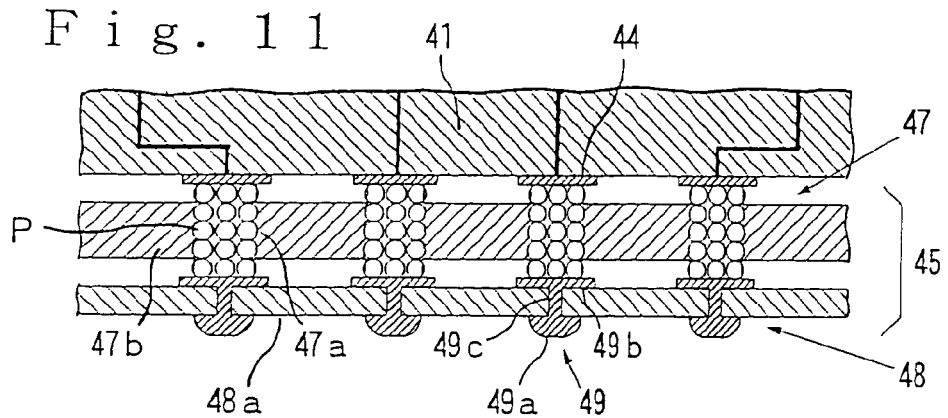
FIG. 11 is a cross-sectional view illustrating the construction of a principal part of another exemplary probe card used in the wafer inspection apparatus according to the present invention.

FIG. 11 is a cross-sectional view illustrating the construction of a principal part of another exemplary probe card. In this probe card, a plurality of flat connecting electrodes 44 are formed on the front surface of the circuit board 41 for connection in accordance with a pattern corresponding to a pattern of electrodes to be inspected of a wafer that is an object of inspection, and a contact member 45 obtained by laminating an anisotropically conductive sheet 47 and a sheet-like connector 48 is arranged on a front surface of the circuit board 41 for connection.

The anisotropically conductive sheet 47 in the contact member 45 is formed by a plurality of conductive parts 47a for connection, which are arranged in accordance with the pattern corresponding to the pattern of the electrodes to be inspected of the wafer that is the object of inspection, and are each obtained by containing conductive particles P in an elastic polymeric substance at a high density, and an insulating part 47b mutually insulating these conductive parts 47a for connection and composed of the elastic polymeric substance.

The sheet-like connector 48 in the contact member 45 is formed by arranging contacts 49 composed of a metallic body and each extending through an insulating sheet 48a in a thickness-wise direction in the insulating sheet 48a. The contacts 49 in the sheet-like connector 48 is each formed by a semi-spherical front-surface electrode 49a exposed to a front surface of the insulating sheet 48a, a flat back-surface electrode 49b exposed to a back surface of the insulating sheet 48a and a short circuit part 49c extending through in the thickness-wise direction of the insulating sheet 48a and linking the front-surface electrode 49a and the back-surface electrode 49b to each other.

The anisotropically conductive sheet 47 in the contact member 45 is arranged on the front surface of the circuit board 41 for connection in such a manner that the conductive parts 47a for connection are located on the respective connecting electrodes 44, and the sheet-like connector 48 is arranged on the front surface of the anisotropically conductive sheet 47 in such a manner that the contact 49 are located on the respective conductive parts 47a for connection.

Such a probe card and a production process thereof are described in, for example, Japanese Patent Application Laid-Open No. 2002-324600.

In the wafer inspection apparatus described above, the wafer 1 that is the object of inspection is mounted on the wafer tray 36, and the circuit board 30 for inspection is pressurized downward by the pressurizing mechanism 35, whereby the contacts of the contact member 45 come into contact with respective electrodes to be inspected of a part of the integrated circuits formed on the wafer 1, thereby achieving necessary electrical connection. The wafer 1 is then heated to a predetermined temperature by the wafer tray 36 to perform necessary electrical inspection (WLBI test or probe test) as to the wafer 1 in this state.

In the above-described process, the pressurizing force by the pressurizing mechanism 35 is selected from a range in which a stable electrical connection of the contact member 45 to the wafer 1 is achieved.

According to such a wafer inspection apparatus, a connector for electrically connecting the circuit board 30 for inspection to the circuit board 41 for connection is the anisotropically conductive connector 10 illustrated in FIGS. 1 and 2, whereby the electrical connection between the inspection electrodes 31 of the circuit board 30 for inspection and the terminal electrodes 42 of the circuit board 41 for connection is surely achieved under small pressurizing force, so that there is no need of using a large-scaled mechanism as the pressurizing mechanism. In addition, since a clearance between the circuit board 30 for inspection and the circuit board 41 for connection is short, the size of the wafer inspection apparatus in the height-wise direction can be made small. Accordingly, the wafer inspection apparatus can be miniaturized as a whole.

Since the pressurizing force applied to the inspection electrodes 31 of the circuit board 30 for inspection is small, the inspection electrodes 31 are not damaged, so that the circuit board 30 for inspection is prevented from shortening the service life thereof.

The inspection electrodes 31 of the circuit board 30 for inspection are electrically connected through the specific anisotropically conductive connector 10, whereby the inspection electrodes 31 can be arranged at a high density. Accordingly, a great number of inspection electrodes 31 can be formed, so that a great number of electrodes to be inspected can be inspected collectively.

In the electrical connection through the anisotropically conductive connector 10, contact resistance can be made low, and a stable connected state can be achieved, so that good electrical properties can be obtained.

Since the inspection electrodes 31 of the circuit board 30 for inspection are electrically connected to the terminal electrodes 42 of the circuit board 41 for connection through the anisotropically conductive connector 10, a distance of a signal transmission system can be made short, so that the wafer inspection apparatus can be adapted to electrical inspection as to high functional integrated circuits of which high-speed processing is required.

Since the frame plate 20 in the anisotropically conductive connector 10 is composed of the material having a low coefficient of linear thermal expansion, a good electrically connected state between the circuit board 30 for inspection and the circuit board 41 for connection can be stably retained even in changes of temperature environment.

Since the specific conductive particles P are filled in the conductive parts 16 for connection in the elastic anisotropically conductive film 15 of the anisotropically conductive connector 10, and the durometer hardness of the conductive parts 16 for connection falls within the specific range, high conductivity is achieved, and moreover a stable electrically connected state to the circuit board 30 for inspection and circuit board 41 for connection is achieved.

Since the electric resistance between the conductive parts 16 for connection is at least 10 MΩ, high reliability on connection to the circuit board 30 for inspection and circuit board 41 for connection is achieved.

The present invention is not limited to the above-described embodiments, and various changes or modifications may be added thereto.

For example, in the anisotropically conductive connector 10, the conductive parts 18 for non-connection in the elastic anisotropically conductive film 15 are not essential.

When that having a plurality of through-holes 21 is used as the frame plate 20, elastic anisotropically conductive films may be formed in the every through-holes 21 independently of one another.

Figure 12:
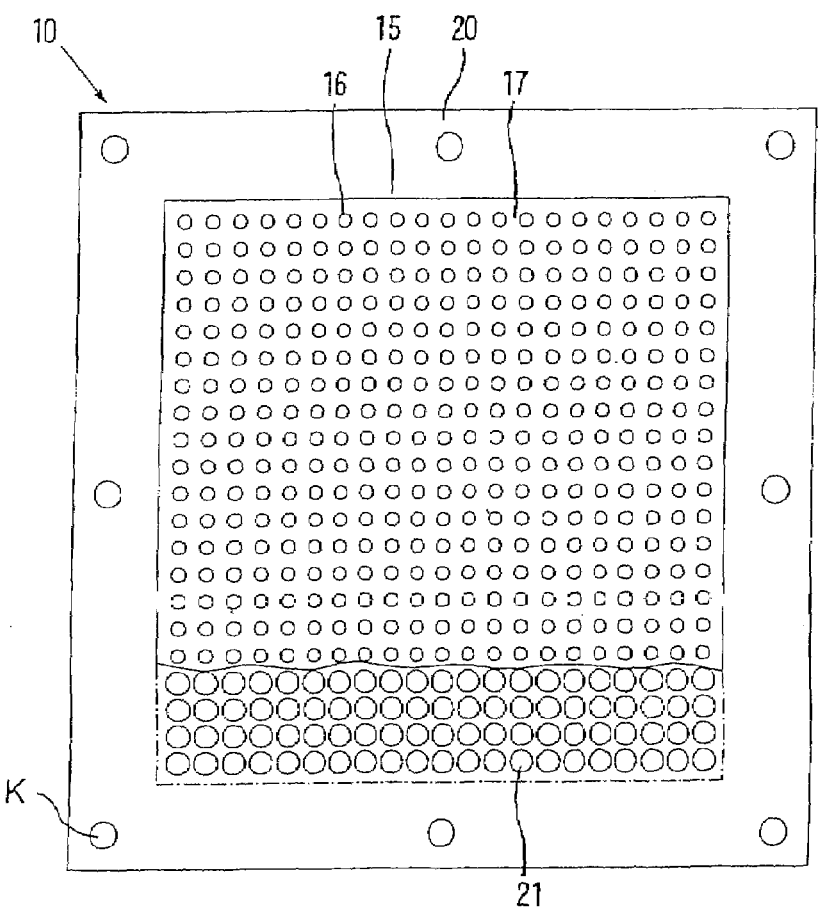
FIG. 12 is a plan view illustrating another exemplary anisotropically conductive connector according to the present invention.
Figure 13:
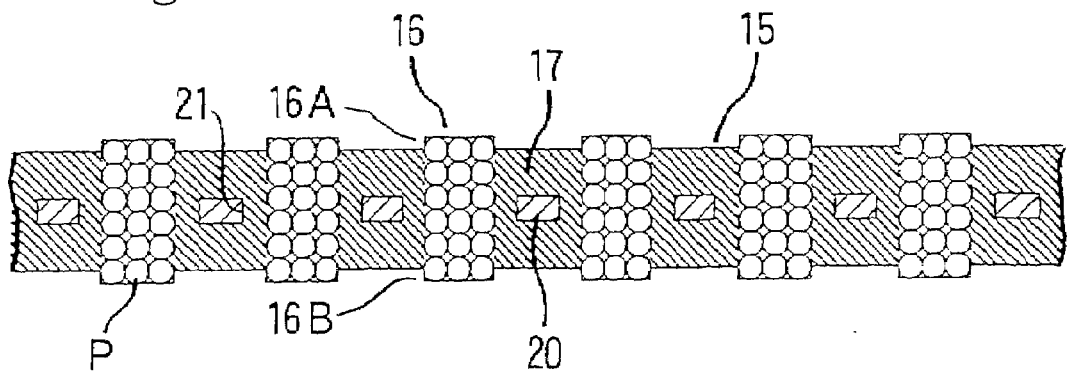
FIG. 13 is a cross-sectional view illustrating, on an enlarged scale, an elastic anisotropically conductive film in the anisotropically conductive connector shown in FIG. 12.

The anisotropically conductive connector 10 may be so constructed that the through-holes 21 in the frame plate 20 are formed in accordance with a pattern corresponding to a pattern of the conductive parts 16 for connection in the elastic anisotropically conductive film 15, and a conductive part 16 for connection is arranged in each through-hole 21 as illustrated in FIGS. 12 and 13.

The frame plate 20 may be in a frame form that a single through-hole is formed.

Figure 14:
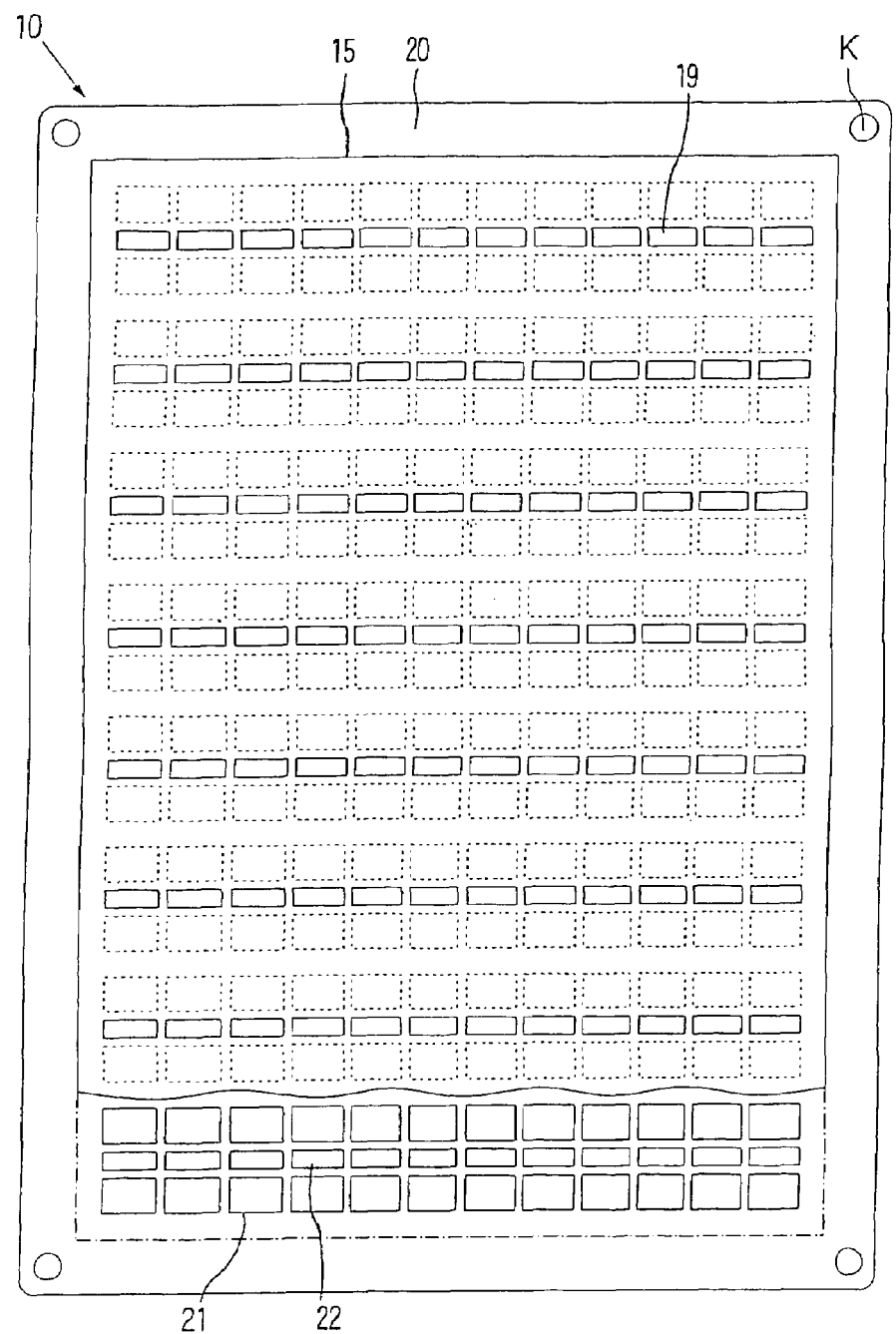
FIG. 14 is a plan view illustrating a further exemplary anisotropically conductive connector according to the present invention.
Figure 15:
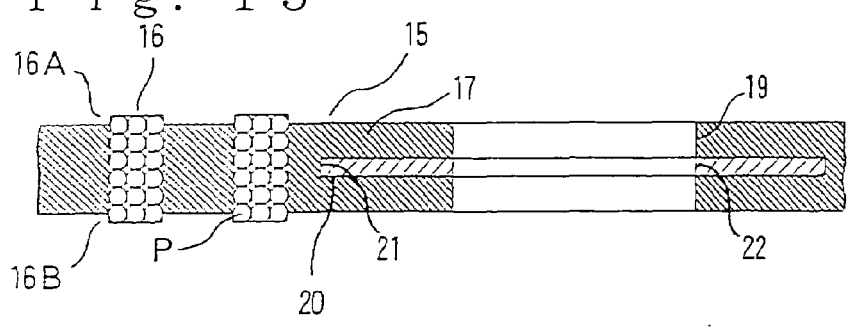
FIG. 15 is a cross-sectional view illustrating, on an enlarged scale, an elastic anisotropically conductive film in the anisotropically conductive connector shown in FIG. 14.

When electronic parts such as chip capacitors are mounted on the circuit board 30 for inspection or circuit board 41 for connection, through-holes 22 for receiving the electronic parts may be formed in the frame plate 20 in addition to the through-holes 21 for arranging the conductive parts for connection as illustrated in FIGS. 14 and 15.

In the wafer inspection apparatus, that having tackiness may be used as the elastic polymeric substance forming the elastic anisotropically conductive film 15 in the anisotropically conductive connector 10 so as to detachably stick the elastic anisotropically conductive film 15 on the circuit board 30 for inspection or circuit board 41 for connection.

It is not essential to fix the three of the circuit board 30 for inspection, the anisotropically conductive connector 10 and the circuit board 41 for connection. More specifically, the apparatus may be so constructed that the elastic anisotropically conductive film 15 in the anisotropically conductive connector 10 is held in an unpressurized loaded state in a non-inspected state, and the elastic anisotropically conductive film 15 in the anisotropically conductive connector 10 is held and pressurized by the circuit board 30 for inspection and the circuit board 41 for connection by pressurizing the circuit board 30 for inspection by the pressurizing mechanism 36, whereby the inspection electrodes 31 in the circuit board 30 for inspection are electrically connected to their corresponding terminal electrodes 42 in the circuit board 41 for connection through the conductive parts 16 for connection in the anisotropically conductive connector 10.

In such a wafer inspection apparatus, the circuit board 30 for inspection is pressurized downward by the pressurizing mechanism 35, whereby the conductive parts 16 for connection in the anisotropically conductive connector 10 are pressurized in the thickness-wise direction, thereby electrically connecting the inspection electrodes 31 of the circuit board 30 for inspection to their corresponding terminal electrodes 42 of the circuit board 41 for connection, and bringing the respective contacts of the contact member 45 into contact with electrodes to be inspected of a part of integrated circuits formed on a wafer 1. Necessary electrical connection is thereby achieved. The wafer 1 is then heated to a predetermined temperature by the wafer tray 36 to perform necessary electrical inspection (WLBI test or probe test) as to the wafer 1 in this state.

EXAMPLES

The present invention will hereinafter be described specifically by the following examples. However, the present invention is not limited to these examples.

Production Example 1 of Mold

A brass plate having a thickness of 3.0 mm was provided, a plurality of magnetic member-receiving recesses, which each had a circular section whose diameter was 0.3 mm and whose depth was 2.7 mm, were formed in one surface of such a non-magnetic base plate by a drilling machine at a pitch of 0.8 mm in an X-X direction (the direction means a direction corresponding to the X-X direction in FIG. 1; the same shall apply hereinafter) and a pitch of 0.8 mm in a Y-Y direction (the direction means a direction perpendicular to the X-X direction; the same shall apply hereinafter) and a plurality of projected portion-forming recesses, which each had a circular section whose diameter was 0.3 mm and whose depth was 0.05 mm, were formed in the other surface of the non-magnetic base plate at a pitch of 0.8 mm in the X-X direction and a pitch of 0.8 mm in the Y-Y direction, thereby producing a non-magnetic base plate. A spherical magnetic member made of iron and having a diameter of 0.3 mm was arranged in each of the magnetic member-receiving recesses in this non-magnetic base plate, and a columnar lid member having a thickness of 2.4 mm and a diameter of 0.3 mm was arranged within each of the magnetic member-receiving recesses so as to close the opening of the recess.

This non-magnetic base plate was arranged on a ferromagnetic base plate made of iron and having a thickness of 6 mm and fixed by a screw mechanism, thereby making a top force. A bottom force was made in the same manner as in the production of the top force to produce a mold of the construction shown in FIG. 5. This mold is referred to as "Mold a".

Production Example 2 of Mold

An iron plate having a thickness of 6 mm was provided, and one surface of this iron plate was subjected to a photo-etching treatment using a dry film resist and ferric chloride, thereby producing an intermediate in which a plurality of disk-like ferromagnetic substance layers each having a thickness of 0.1 mm and a diameter of 0.25 mm had been integrally formed at a pitch of 0.65 mm in the X-X direction and a pitch of 0.65 mm in the Y-Y direction on a ferromagnetic base plate made of iron and having a thickness of 5.9 mm.

Non-magnetic substance layers each having a thickness of 0.15 mm were formed at other areas than the ferromagnetic substance layers on said one surface of the intermediate by using a resist, thereby making a top force. A bottom force was made in the same manner as in the production of the top force to produce a mold of the construction shown in FIG. 7. This mold is referred to as "Mold b".

Production Example 3 of Mold

An iron plate having a thickness of 6 mm was provided, and one surface of this iron plate was subjected to a photo-etching treatment using a dry film resist and ferric chloride, thereby producing an intermediate in which a plurality of disk-like ferromagnetic substance layers each having a thickness of 0.1 mm and a diameter of 0.40 mm had been integrally formed at a pitch of 1.00 mm in the X-X direction and a pitch of 1.00 mm in the Y-Y direction on a ferromagnetic base plate made of iron and having a thickness of 5.9 mm.

Non-magnetic substance layers each having a thickness of 0.2 mm were formed at other areas than the ferromagnetic substance layers on said one surface of the intermediate by using a resist, thereby making a top force. A bottom force was made in the same manner as in the production of the top force to produce a mold of the construction shown in FIG. 7. This mold is referred to as "Mold c".

Example 1

A frame plate composed of stainless steel (SUS-304, coefficient of linear thermal expansion: $1.73 \times 10^{-5}$ $K^{-1}$) and having a thickness of 0.15 mm, in which 16 rectangular through-holes each having dimensions of 12.5 mm×11.5 mm had been formed so as to align vertically and laterally (4×4 through-holes), was produced, and 2 spacers each composed of stainless steel (SUS-304) and having a thickness of 0.1 mm, in which a rectangular through-hole having dimensions of 57 mm×53 mm had been formed, were produced.

On the other hand, 4.5 g of conductive particles having a number average particle diameter of 30 μm were added to and mixed with 12 g of addition type liquid silicone rubber, "X-34-1632" (product of Shin-Etsu Chemical Co., Ltd.), thereby preparing a molding material for molding an elastic anisotropically conductive film. Those obtained by forming a coating layer formed of gold and having a thickness of 75 nm on surfaces of core particles formed of nickel were used herein, as the conductive particles.

The frame plate was then arranged in alignment on an upper surface of the bottom force in Mold a through the spacer, the top force was arranged in alignment on the frame plate through the spacer, and the molding material prepared above was filled in a molding cavity formed by the top force, the bottom force, the two spacers and the frame plate to form a molding material layer.

Electromagnets were then arranged on the upper surface of the ferromagnetic base plate in the top force and the lower surface of the ferromagnetic base plate in the bottom force and were operated, whereby the molding material layer was subjected to a curing treatment under conditions of 100° C. and 1.5 hours while applying a parallel magnetic field of 1 tesla between the magnetic members of the top force and their corresponding magnetic members of the bottom force, thereby forming an elastic anisotropically conductive film in the frame plate to produce an anisotropically conductive connector of the construction shown in FIG. 1.

Example 2

A frame plate composed of 42 alloy (coefficient of linear thermal expansion: $5 \times 10^{-6}$ $K^{-1}$) and having a thickness of 0.1 mm, in which 64 rectangular through-holes each having dimensions of 8.5 mm×8.5 mm had been formed so as to align vertically and laterally (8×8 through-holes), was produced, and 2 spacers each composed of phosphor bronze and having a thickness of 0.1 mm, in which a rectangular through-hole having dimensions of 83 mm×83 mm had been formed, were produced.

On the other hand, 8.8 g of conductive particles having a number average particle diameter of 40 μm were added to and mixed with 16 g of addition type liquid silicone rubber, "KE-2000-20" (product of Shin-Etsu Chemical Co., Ltd.), thereby preparing a molding material for molding an elastic anisotropically conductive film. Those obtained by forming a coating layer formed of gold and having a thickness of 84 nm on surfaces of core particles formed of nickel were used herein, as the conductive particles.

The frame plate was then arranged in alignment on an upper surface of the bottom force in Mold b through the spacer, the top force was arranged in alignment on the frame plate through the spacer, and the molding material prepared above was filled in a molding cavity formed by the top force, the bottom force, the two spacers and the frame plate to form a molding material layer.

Electromagnets were then arranged on the upper surface of the ferromagnetic base plate in the top force and the lower surface of the ferromagnetic base plate in the bottom force and were operated, whereby the molding material layer was subjected to a curing treatment under conditions of 100° C. and 1.5 hours while applying a parallel magnetic field of 1 tesla between the magnetic members of the top force and their corresponding magnetic members of the bottom force, thereby forming an elastic anisotropically conductive film in the frame plate to produce an anisotropically conductive connector of the construction shown in FIG. 1.

Example 3

A frame plate composed of stainless steel (SUS-304, coefficient of linear thermal expansion: $1.73 \times 10^{-5}$ $K^{-1}$) and having a thickness of 0.10 mm, in which a plurality of circular through-holes each having a diameter of 0.5 mm had been formed so as to align vertically and laterally at a pitch of 0.8 mm, was produced, and an elastic anisotropically conductive film was formed in this frame plate in the same manner as in Example 1, thereby producing an anisotropically conductive connector of the construction shown in FIG. 12.

Example 4

A frame plate composed of stainless steel (SUS-304, coefficient of linear thermal expansion: $1.73 \times 10^{-5}$ $K^{-1}$) and having a thickness of 0.15 mm, in which 144 sets of through-holes, one set of said sets of through-holes being composed of 3 through-holes of 2 rectangular through-holes each having dimensions of 6.0 mm×4.0 mm and arranged in a state separated from each other for arranging a conductive part for connection and a rectangular through-hole having dimensions of 6.0 mm×1.7 mm for receiving an electronic part, which had been arranged so as to alternately align in a lateral direction (said set composed of these 3 through-holes being hereinafter referred to as "a through-hole set"), had been formed so as to align vertically and laterally (12×12 sets), was produced, and 2 spacers each composed of stainless steel (SUS-304) and having a thickness of 0.1 mm, in which a rectangular through-hole having dimensions of 144 mm×84 mm had been formed, were produced. In the above-described process, a clearance between the through-holes in one through-hole set is 0.5 mm, a pitch of the through-hole sets (center distance between the through-holes for receiving the electronic part in adjoining through-hole sets) is 11.9 mm in the lateral direction and 6.9 mm in the vertical direction in the frame plate.

On the other hand, 10.0 g of conductive particles having a number average particle diameter of 40 μm were added to and mixed with 16 g of addition type liquid silicone rubber, "KE-2000-20" (product of Shin-Etsu Chemical Co., Ltd.), thereby preparing a molding material for molding an elastic anisotropically conductive film. Those obtained by forming a coating layer formed of gold and having a thickness of 84 nm on surfaces of core particles formed of nickel were used herein, as the conductive particles.

The frame plate was then arranged in alignment on an upper surface of the bottom force in Mold c through the spacer, the top force was arranged in alignment on the frame plate through the spacer, and the molding material prepared above was filled in a molding cavity formed by the top force, the bottom force, the two spacers and the frame plate to form a molding material layer.

Electromagnets were then arranged on the upper surface of the ferromagnetic base plate in the top force and the lower surface of the ferromagnetic base plate in the bottom force and were operated, whereby the molding material layer was subjected to a curing treatment under conditions of 100° C. and 1.5 hours while applying a parallel magnetic field of 1 tesla between the magnetic members of the top force and their corresponding magnetic members of the bottom force, thereby forming an elastic anisotropically conductive film in the frame plate.

The elastic anisotropically conductive film thus formed was then subjected to laser beam machining, thereby forming rectangular through-holes in the elastic anisotropically conductive film, linking to the respective through-holes for receiving the electronic part of the frame plate and having dimensions of 6.0 mm×1.7 mm to produce an anisotropically conductive connector of the construction shown in FIG. 14.

In the above-described process, the laser beam machining for the elastic anisotropically conductive film was conducted by means of a carbon dioxide laser (manufactured by Mitsubishi Electric Corp.) under conditions that an output was 10 A, a frequency was 100 Hz, a scanning speed was 2,400 mm/min, and a beam diameter was 150 μm.

Comparative Example 1

An anisotropically conductive connector was produced in the same manner as in Example 1 except that a frame plate composed of PET (coefficient of linear thermal expansion: $6 \times 10^{-5}$ $K^{-1}$) and having a thickness of 0.15 mm, in which 16 rectangular through-holes each having dimensions of 12.5 mm×11.5 mm had been formed so as to align vertically and laterally (4×4 through-holes), was used as the frame plate.

In the resultant anisotropically conductive connector, distortion was caused on the elastic anisotropically conductive film by shrinkage on curing of the silicone rubber in the curing treatment of the molding material layer. As a result, warpage was caused on the anisotropically conductive connector, so that the planarity of the surface thereof was not retained. In addition, the conductive parts for connection of the elastic anisotropically conductive film underwent positional deviation from the prescribed positions, so that it was difficult to achieve electrical connection between a circuit board for inspection and a circuit board for connection in a wafer inspection apparatus.

Comparative Example 2

A molding material for molding an elastic anisotropically conductive film was prepared by adding and mixing 4.5 g of conductive particles having a number average particle diameter of 120 μm into 12 g of addition type liquid silicone rubber, "X-34-1632" (product of Shin-Etsu Chemical Co., Ltd.). Those obtained by forming a coating layer formed of gold and having a thickness of 125 nm on surfaces of core particles formed of nickel were used herein, as the conductive particles.

An anisotropically conductive connector was produced in the same manner as in Example 1 except that this molding material was used.

Comparative Example 3

A molding material for molding an elastic anisotropically conductive film was prepared by adding and mixing 4.5 g of conductive particles having a number average particle diameter of 30 μm into 12 g of addition type liquid silicone rubber, "KE-2000-60" (product of Shin-Etsu Chemical Co., Ltd.). Those obtained by forming a coating layer formed of gold and having a thickness of 75 nm on surfaces of core particles formed of nickel were used herein, as the conductive particles.

An anisotropically conductive connector was produced in the same manner as in Example 1 except that this molding material was used.

Dimensions of the respective parts, proportions of the conductive particles in the conductive parts for connection and durometer hardness of the conductive parts for connection in the anisotropically conductive connectors according to Examples 1 to 4 and Comparative Examples 1 to 3 are shown in Table 1.

TABLE 1

|  |  | Example 1 | Example 2 | Example 3 | Example 4 | Comparative Example 1 | Comparative Example 2 | Comparative Example 3 |
|---|---|---|---|---|---|---|---|---|
| Frame Plate |  |  |  |  |  |  |  |  |
| Thickness (mm) |  | 0.15 | 0.1 | 0.1 | 0.15 | 0.15 | 0.15 | 0.15 |
| Dimensions of | Length (mm) | 12.5 | 8.5 | 0.5 | 6.0 | 12.5 | 12.5 | 12.5 |
| Through-hole for | Width (mm) | 11.5 | 8.5 | 0.5 | 4.0 | 11.5 | 11.5 | 11.5 |
| Arranging a |  |  |  |  |  |  |  |  |
| Conductive Part |  |  |  |  |  |  |  |  |

TABLE 1-continued

|  |  | Example 1 | Example 2 | Example 3 | Example 4 | Comparative Example 1 | Comparative Example 2 | Comparative Example 3 |
|---|---|---|---|---|---|---|---|---|
| Dimensions of Through-hole for Receiving an Electronic Part | Length (mm) | — | — | — | 6.0 | — | — | — |
|  | Width (mm) | — | — | — | 1.7 | — | — | — |
| Coefficient of Linear Thermal Expansion Elastic Anisotropically Conductive Film | ($\times 10^{-5} K^{-1}$) | 1.73 | 0.5 | 1.73 | 1.73 | 6 | 1.73 | 1.73 |
| Conductive Part for Connection |  |  |  |  |  |  |  |  |
| Diameter (mm) |  | 0.30 | 0.25 | 0.30 | 0.40 | 0.30 | 0.30 | 0.30 |
| Thickness (mm) |  | 0.45 | 0.40 | 0.40 | 0.55 | 0.40 | 0.45 | 0.45 |
| Projected Height (mm) |  | 0.05 | 0.05 | 0.05 | 0.10 | 0.05 | 0.05 | 0.05 |
| Pitch (mm) |  | 0.8 | 0.65 | 0.8 | 1.0 | 0.8 | 0.8 | 0.8 |
| Conductive Particle |  |  |  |  |  |  |  |  |
| Number Average Particle Diameter ($\mu m$) |  | 30 | 40 | 30 | 40 | 30 | 120 | 30 |
| Coating Layer |  |  |  |  |  |  |  |  |
| Thickness (nm) |  | 75 | 84 | 75 | 84 | 75 | 125 | 75 |
| Coating Rate (mass %) |  | 15 | 15 | 15 | 15 | 15 | 8 | 15 |
| Proportion (volume %) |  | 25 | 30 | 25 | 27 | 25 | 25 | 25 |
| Durometer Hardness |  | 33 | 24 | 33 | 23 | 33 | 32 | 63 |
| Thickness of Insulating Part (mm) |  | 0.35 | 0.30 | 0.30 | 0.35 | 0.30 | 0.35 | 0.35 |

[Evaluation of Anisotropically Conductive Connector]

After the anisotropically conductive connectors according to Examples 1 to 4 and Comparative Examples 2 and 3 were subjected to a post curing treatment under conditions of 200° C. and 2 hours, the following Test 1 and Test 2 were performed on these anisotropically conductive connectors. Further, the following Test 3 and Test 4 were performed on the anisotropically conductive connectors according to Examples 1 to 4 and Comparative Example 2.

Test 1:

One electrode plate for test, on one surface of which a plurality of patterned electrodes plated with gold on the surfaces thereof had been formed in accordance with the same pattern as a pattern of conductive parts for connection of an elastic anisotropically conductive film, and the other electrode plate for test, on one surface of which a plurality of patterned electrodes plated with gold on the surfaces thereof had been formed in accordance with a pattern antipodal to the pattern of the conductive parts for connection of the elastic anisotropically conductive film, were provided. An anisotropically conductive connector was arranged in alignment on said one electrode plate for test in a state positioned in such a manner that the conductive parts for connection of the elastic anisotropically conductive film thereof are located on the respective patterned electrodes of the electrode plate for test, and the other electrode plate was arranged in alignment on the elastic anisotropically conductive film in this anisotropically conductive connector so as to locate the patterned electrodes thereof on the respective conductive parts for connection.

The elastic anisotropically conductive film in the anisotropically conductive connector was then pressurized in a thickness-wise direction thereof by the other electrode plate for test under an environment of 80° C. so as to give a load of 20 g per a conductive part for connection. After the anisotropically conductive connector was held for 15 minutes in this state, an electric resistance (hereinafter referred to as "conduction resistance") of each of the conductive parts for connection in the thickness-wise direction and an electric resistance (hereinafter referred to as "insulation resistance") between adjoining conductive parts for connection were measured. After completion of the measurement of these electric resistances, the pressurization of the elastic anisotropically conductive film by the other electrode plate for test was released, and the anisotropically conductive connector was held for 5 minutes in this state. This process was regarded as a cycle, and the cycle was repeated 3,000 times in total.

The average value, maximum value and minimum value of the conduction resistance, and the minimum value of the insulation resistance in the first cycle, and the average value, maximum value and minimum value of the conduction resistance, and the minimum value of the insulation resistance in the three thousandth cycle are shown in the following Table 2.

Figure 16:
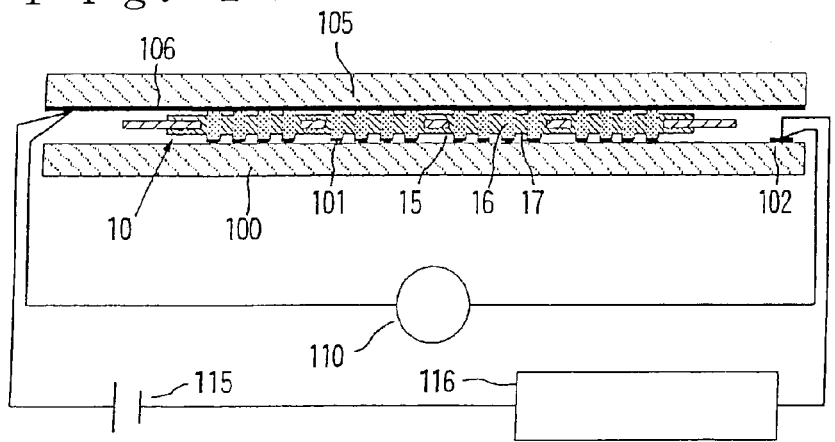
FIG. 16 illustrates the construction of an apparatus used for conducting Test 2 in Examples.

Test 2:

As illustrated in FIG. 16, one electrode plate 100 for test, on one surface of which a plurality of patterned electrodes 101 plated with gold had been formed in a central region in accordance with the same pattern as a pattern of conductive parts 16 for connection of an elastic anisotropically conductive film 15, and on said one surface of which a plurality of lead electrodes 102 electrically connected to the respective patterned electrodes 101 by a printed wiring (not illustrated) had been formed in a peripheral edge region, and the other electrode plate 105 for test, on the whole of one surface of which a common electrode 106 plated with gold had been formed, were provided. An anisotropically conductive connector 10 was arranged on said one electrode plate 100 for test in a state positioned in such a manner that the conductive parts 16 for connection of the elastic anisotropically conductive film 15 thereof are located on the respective patterned electrodes 101 of the electrode plate 100 for test, and the other electrode plate 105 for test was arranged on the elastic anisotropically conductive film 15 in this anisotropically conductive connector 10. The respective lead electrodes 102 in said one electrode plate 100 for test and the common electrode 106 in the other electrode plate 105 for test were electrically connected to a voltmeter 110, and moreover electrically connected to a DC power source 115 through a constant-current controller 116 in parallel with the voltmeter 110.

The elastic anisotropically conductive film 15 in the anisotropically conductive connector 10 was then pressurized in a thickness-wise direction thereof by the other electrode plate 105 for test under an environment of room temperature so as to give a load of 20 g per a conductive part 16 for connection. After a DC current of 1 A was applied to one of the conductive parts 16 for connection of the elastic anisotropically conductive film 15 for 20 seconds by the DC power source 115 and the constant-current controller 116 in this state, a voltage in the conductive part 16 for connection was measured by the voltmeter 110. This voltage measurement was successively performed on all the conductive parts 16 for connection. Supposing that the DC current applied to the conductive part 16 for connection is $I_1$ (=1 A), and a voltage value (V) of the conductive part 16 for connection measured is $V_1$, a conduction resistance $R_1$ was determined in accordance with the following equation (II). After the conductive parts 16 for connection of the elastic anisotropically conductive film 15 were pressed 3,000 times in the same manner as in Test 1, a conduction resistance $R_1$ of each of the conductive parts 16 for connection of the elastic anisotropically conductive film 15 was found in the same manner as described above. When a value of the conduction resistance $R_1$ is 100 mΩ or lower, an allowable current value of the conductive part 16 for connection is 1 A or higher. The average value of the conduction resistance $R_1$ is shown in the following Table 2.

$$R_1 = V_1/I_1 \quad \text{Equation (II)}$$

Test 3:

One electrode plate for test, on one surface of which a plurality of patterned electrodes plated with gold on the surfaces thereof had been formed in accordance with the same pattern as a pattern of conductive parts for connection of an elastic anisotropically conductive film, and the other electrode plate for test, on one surface of which a plurality of patterned electrodes plated with gold on the surfaces thereof had been formed in accordance with a pattern antipodal to the pattern of the conductive parts for connection of the elastic anisotropically conductive film, were provided. An anisotropically conductive connector was arranged on said one electrode plate for test in a state positioned in such a manner that the conductive parts for connection of the elastic anisotropically conductive film thereof are located on the respective patterned electrodes of the electrode plate for test, and the other electrode plate for test was arranged in alignment on the elastic anisotropically conductive film in this anisotropically conductive connector so as to locate the patterned electrodes thereof on the respective conductive parts for connection.

The elastic anisotropically conductive film in the anisotropically conductive connector was then pressurized in a thickness-wise direction thereof by the other electrode plate for test under an environment of 80° C. so as to give a distortion factor of 20% to the conductive parts for connection to measure the conduction resistance and insulation resistance of each of the conductive parts for connection. After the pressurization against the anisotropically conductive connector was held additionally for 3,000 hours, the conduction resistance and insulation resistance of each of the conductive parts for connection were measured.

The average value, maximum value and minimum value of the conduction resistance, and the minimum value of the insulation resistance at an initial time, and the average value, maximum value and minimum value of the conduction resistance, and the minimum value of the insulation resistance after 3,000 hours elapsed are shown in Table 3.

Figure 17:
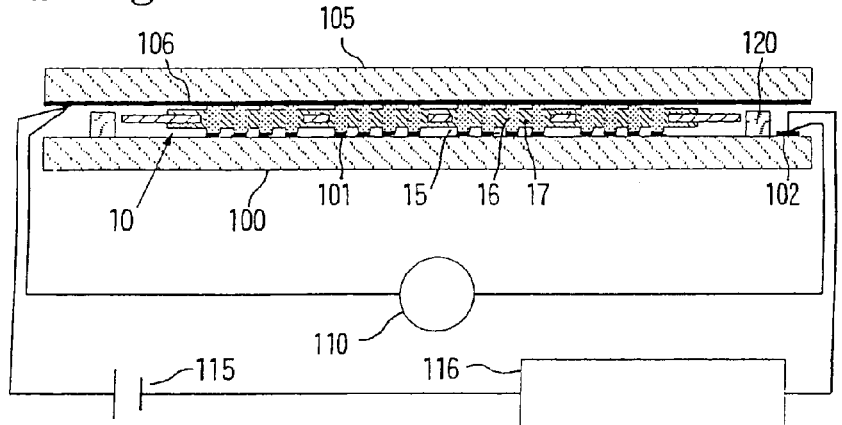
FIG. 17 illustrates the construction of an apparatus used for conducting Test 4 in Examples.
Figure 18:
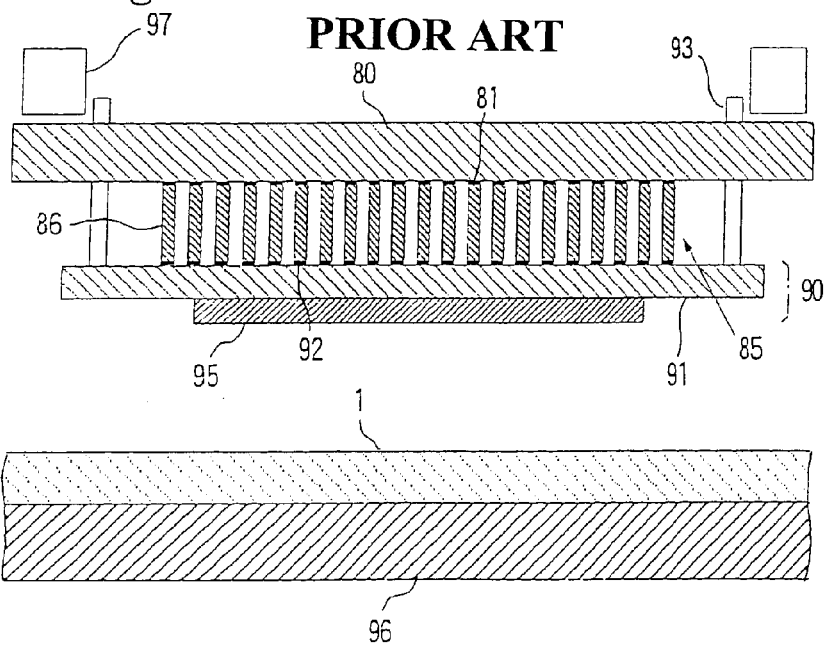
FIG. 18 is a cross-sectional view illustrating the construction of an exemplary conventional wafer inspection apparatus.

Test 4:

As illustrated in FIG. 17, one electrode plate 100 for test having a size greater than an anisotropically conductive connector 10, on one surface of which a plurality of patterned electrodes 101 plated with gold on the surfaces thereof had been formed in a central region in accordance with the same pattern as a pattern of conductive parts 16 for connection of an elastic anisotropically conductive film 15, and on said one surface of which a plurality of lead electrodes 102 electrically connected to the respective patterned electrodes 101 by a printed wiring (not illustrated) had been formed in a peripheral edge region, and the other electrode plate 105 for test having a size greater than the anisotropically conductive connector 10, on the whole of one surface of which a common electrode 106 plated with gold had been formed, were provided. The anisotropically conductive connector 10 was arranged on said one electrode plate 100 for

TABLE 2

| | Test 1 | | | | | | | | | | Test 2 Conduction Resistance $R_1$ (mΩ) |
|---|---|---|---|---|---|---|---|---|---|---|---|
| | First Cycle | | | | | Three Thousandth Cycle | | | | | |
| | Conduction Resistance | | | | Minimum | Conduction Resistance | | | | Minimum | |
| | Average Value (mΩ) | Maximum Value (mΩ) | Minimum Value (mΩ) | Coefficient of Variation (%) | Value of Insulation Resistance (Ω) | Average Value (mΩ) | Maximum Value (mΩ) | Minimum Value (mΩ) | Coefficient of Variation (%) | Value of Insulation Resistance (Ω) | Initial / After Pressing 3000 Times |
| Example 1 | 34 | 58 | 23 | 28 | >10 M | 56 | 86 | 42 | 29 | >10 M | 38 / 61 |
| Example 2 | 38 | 61 | 29 | 31 | >10 M | 63 | 93 | 48 | 33 | >10 M | 41 / 68 |
| Example 3 | 38 | 63 | 26 | 30 | >10 M | 61 | 96 | 47 | 35 | >10 M | 42 / 70 |
| Example 4 | 29 | 49 | 18 | 32 | >10 M | 48 | 78 | 35 | 36 | >10 M | 32 / 56 |
| Comparative Example 1 | | | | | | Not Tested | | | | | |
| Comparative Example 2 | 85 | 126 | 28 | 67 | >10 M | 156 | 328 | 84 | 56 | >10 M | 76 / 175 |
| Comparative Example 3 | 68 | 87 | 46 | 26 | >10 M | 113 | 223 | 73 | 42 | >10 M | 65 / 128 | test in a state positioned in such a manner that the conductive parts 16 for connection 15 thereof are located on the respective patterned electrodes 101 of the electrode plate 100 for test, and the other electrode plate 105 for test was arranged on the elastic anisotropically conductive film 15 in this anisotropically conductive connector 10. The respective lead electrodes 102 in said one electrode plate 100 for test and the common electrode 106 in the other electrode plate 105 for test were electrically connected to a voltmeter 110, and moreover electrically connected to a DC power source 115 through a constant-current controller 116 in parallel with the voltmeter 110. An electrically insulating frame-like spacer 120 having a thickness of 80% of the overall thickness of the elastic anisotropically conductive film 15 in the anisotropically conductive connector 10 was further arranged between said one electrode plate 100 for test and the other electrode plate 105 for test.

The other electrode plate 105 for test was then pressurized in a thickness-wise direction thereof at a position outside the spacer 120 on the other surface of the other electrode plate 105 for test under an environment of room temperature to compress and deform the anisotropically conductive connector 10, thereby bringing the common electrode 106 of the other electrode plate 105 for test into contact with the spacer 120. In this state, a distortion factor of the conductive parts 16 for connection in the anisotropically conductive connector 10 is 20%.

After a DC current of 1 A was then applied to one of the conductive parts 16 for connection of the anisotropically conductive connector 10 for 20 seconds by the DC power source 115 and the constant-current controller 116, a voltage in the conductive part 16 for connection was measured by the voltmeter 110. This voltage measurement was successively performed on all the conductive parts 16 for connection. Supposing that the DC current applied to the conductive part 16 for connection is $I_2$ (=1 A), and a voltage value (V) of the conductive part 16 for connection measured is $V_2$, a conduction resistance $R_2$ was determined in accordance with the following equation (III). After the conductive parts 16 for connection of the anisotropically conductive connector 10 were pressurized for 3,000 hours in the same manner as in Test 3, a conduction resistance $R_2$ of the anisotropically conductive connector 10 was determined in the same manner as described above. When a value of the conduction resistance $R_2$ is 100 mΩ or lower, an allowable current value of the conductive part 16 for connection is 1 A or higher. The average value of the conduction resistance $R_2$ is shown in the following Table 3.

When the other electrode plate for test was pressurized in Test 3 and Test 4 in such a manner that the distortion factor of the conductive parts 16 for connection of the anisotropically conductive connector 10 is 20%, and the deformation by the pressurization of the other electrode plate for test is great, there is a possibility that the other electrode plate for test may be broken. Therefore, the tests were stopped when the deformation (warpage) of the electrode plate for test by the pressurization amounted to 0.1 mm or greater.

$$R_2 = V_2/I_2 \qquad \text{Equation (III)}$$

TABLE 2

| | Test 3 | | | | | | | | | | Test 4 Conduction Resistance $R_2$ (mΩ) | |
|---|---|---|---|---|---|---|---|---|---|---|---|---|
| | Initial Time | | | | | After 3000 Hours | | | | | | |
| | Conduction Resistance | | | | Minimum | Conduction Resistance | | | | Minimum | | |
| | Average Value (mΩ) | Maximum Value (mΩ) | Minimum Value (mΩ) | Coefficient of Variation (%) | Value of Insulation Resistance (Ω) | Average Value (mΩ) | Maximum Value (mΩ) | Minimum Value (mΩ) | Coefficient of Variation (%) | Value of Insulation Resistance (Ω) | Initial Time | After Pressurized for 3000 Hours |
| Example 1 | 32 | 51 | 22 | 26 | >10 M | 34 | 56 | 28 | 27 | >10 M | 35 | 47 |
| Example 2 | 37 | 58 | 31 | 24 | >10 M | 41 | 65 | 35 | 25 | >10 M | 40 | 51 |
| Example 3 | 36 | 59 | 24 | 28 | >10 M | 40 | 64 | 36 | 29 | >10 M | 38 | 48 |
| Example 4 | 27 | 45 | 16 | 29 | >10 M | 32 | 51 | 23 | 30 | >10 M | 28 | 42 |
| Comparative Example 1 | | | | | | Not Tested | | | | | | |
| Comparative Example 2 | 76 | 135 | 31 | 65 | >10 M | 124 | 282 | 83 | 52 | >10 M | 70 | 134 |
| Comparative Example 3 | | | | | | Test Stopped | | | | | | |

As apparent from Tables 2 and 3, it is understood that according to the anisotropically conductive connectors according to Examples 1 to 4, a good electrically connected state is achieved, the good electrically connected state is stably retained even when the anisotropically conductive connectors are used for a long period of time under a high-temperature environment.

In the anisotropically conductive connector according to Comparative Example 1 on the other hand, the frame plate was greatly deformed by shrinkage on curing of the silicone rubber in the step of forming the elastic anisotropically conductive film because the frame plate supporting the elastic anisotropically conductive film was composed of polyethylene terephthalate. It was thus difficult to conduct the positioning and fixing of the electrodes of the electrode plates for test.

In the anisotropically conductive connector according to Comparative Example 2, variations in the conductivity in thickness-wise direction among the conductive parts for connection were great, and the electric resistance values of the conductive parts for connection were raised when the anisotropically conductive connector was used for a long period of time because the particle diameter of the conductive particles contained in the conductive parts for connection was great, so that stable electrical connection was not retained.

In the anisotropically conductive connector according to Comparative Example 3, it was difficult to pressurize the conductive parts for connection of the anisotropically conductive connector so as to give a distortion factor of 20% without deforming the electrode plate for test by the pressurization because the durometer hardness of the conductive parts for connection is high. Such an anisotropically conductive connector is difficult to achieve electrical connection to a wafer without deforming or breaking the circuit board for inspection and the circuit board for connection when it is used in a wafer inspection apparatus, and thus involves a problem upon practical use.

The invention claimed is:

1. An anisotropically conductive connector suitably used for, in a wafer inspection apparatus for performing electrical inspection of a great number of integrated circuits formed on a wafer, which comprises: a circuit board for inspection having a great number of inspection electrodes on a front surface thereof; and a probe card having a circuit board for connection, on the back surface of which a plurality of terminal electrodes have been formed in accordance with a pattern corresponding to a pattern of the inspection electrodes of the circuit board for inspection, and a contact member, which is provided on the front surface of the circuit board for connection, and on which a great number of contacts brought into contact with respective electrodes to be inspected of the integrated circuits on the wafer, which is an object of inspection, have been arranged, and arranged in such a manner that the terminal electrodes of the circuit board for connection are opposed to their corresponding inspection electrodes of the circuit board for inspection, electrically connecting the inspection electrodes to the respective terminal electrodes by being arranged between the circuit board for inspection and the circuit board for connection in the probe card, and the anisotropically conductive connector comprises an elastic anisotropically conductive film composed of a plurality of conductive parts for connection each extending in a thickness-wise direction of the film and arranged in a state separated from each other along a plane direction of the film and an insulating part formed among these conductive parts for connection, and a frame plate for supporting the elastic anisotropically conductive film, wherein the frame plate is formed of a metallic material having a coefficient of linear thermal expansion of $3 \times 10^{-6}$ to $2 \times 10^{-5} K^{-1}$, the conductive parts for connection in the elastic anisotropically conductive film are obtained by filling conductive particles having a number average particle diameter of 20 to 80 µm and exhibiting magnetism in an elastic polymeric substance at a high density, the conductive particles have, on a surface of which, a coating layer composed of a noble metal and having a thickness of at least 20 nm, each of the conductive parts for connection has a durometer hardness of 10 to 35, and an electric resistance between conductive parts for connection adjoining each other is at least 10 MΩ.

2. The anisotropically conductive connector according to claim 1, wherein the frame plate has at least one through-hole extending in the thickness-wise direction, and the elastic anisotropically conductive film is arranged in such a manner that the conductive parts for connection thereof are located within the through-hole in the frame plate.

3. The anisotropically conductive connector according to claim 1, wherein the frame plate has a plurality of through-holes each extending in the thickness-wise direction, and the elastic anisotropically conductive film is arranged in such a manner that the conductive parts for connection thereof are located within the respective through-holes in the frame plate.

4. The anisotropically conductive connector according to claim 1, wherein an allowable current value of each of the conductive parts for connection when the conductive part for connection is pressurized in the thickness-wise direction under a load of 20 g is at least 1 A.

5. The anisotropically conductive connector according to claim 1, wherein an allowable current value of each of the conductive parts for connection when the conductive part for connection is pressurized in the thickness-wise direction so as to give a distortion factor of 20% is at least 1 A.

6. The anisotropically conductive connector according to claim 1, wherein an electric resistance of each of the conductive parts for connection in the thickness-wise direction as measured in a state that the conductive part for connection has been pressurized in the thickness-wise direction under a load of 20 g is at most 0.1 Ω, and an electric resistance of the conductive part for connection in the thickness-wise direction as measured in a state that the conductive part for connection has been pressurized in the thickness-wise direction under a load of 20 g after a cycle that the conductive part for connection is pressurized for 15 minutes in the thickness-wise direction under a load of 20 g in an environment of 80° C. in temperature, and the conductive part for connection is then held for 5 minutes in an unloaded state was repeated 3,000 times is at most 0.1 Ω.

7. The anisotropically conductive connector according to claim 1, wherein an electric resistance of each of the conductive parts for connection in the thickness-wise direction as measured in a state that the conductive part for connection has been pressurized in the thickness-wise direction so as to give a distortion factor of 20% is at most 0.1 Ω, and an electric resistance of the conductive part for connection in the thickness-wise direction as measured after a current of 1 A is applied to the conductive part for connection for 3,000 hours in a state that the conductive part for connection had been pressurized in the thickness-wise direction in an environment of 80° C. in temperature so as to give a distortion factor of 20% is at most 0.1 Ω.

8. A wafer inspection apparatus for performing electrical inspection of a great number of integrated circuits formed on a wafer, which comprises:

a circuit board for inspection having a great number of inspection electrodes on a front surface thereof;

a probe card having a circuit board for connection, on the back surface of which a plurality of terminal electrodes have been formed in accordance with a pattern corresponding to a pattern of the inspection electrodes of the circuit board for inspection, and a contact member, which is provided on the front surface of the circuit board for connection, and on which a great number of contacts brought into contact with respective electrodes to be inspected of the integrated circuits on the wafer, which is an object of inspection, have been arranged, and arranged in such a manner that the terminal electrodes of the circuit board for connection are opposed to their corresponding inspection electrodes of the circuit board for inspection; and the anisotropically conductive connector according to any one of claims 1 to 7, which is arranged between the circuit board for inspection and the circuit board for connection in the probe card to respectively electrically connect the inspection electrodes to the terminal electrodes.

9. The wafer inspection apparatus according to claim 8, wherein the three of the circuit board for inspection, the anisotropically conductive connector and the circuit board for connection are fixed in a state that the elastic anisotropically conductive film in the anisotropically conductive connector has been held and pressurized by the circuit board for inspection and the circuit board for connection, thereby the inspection electrodes in the circuit board for inspection and their corresponding terminal electrodes in the circuit board for connection are electrically connected through the conductive parts for connection in the anisotropically conductive connector.

10. The wafer inspection apparatus according to claim 8, which comprises a pressurizing mechanism for pressurizing the circuit board for inspection to electrically connect the respective contacts of the contact member in the probe card to the electrodes to be inspected in the wafer, which is the object of inspection, wherein the circuit board for inspection is pressurized by the pressurizing mechanism, whereby the elastic anisotropically conductive film in the anisotropically conductive connector is held and pressurized by the circuit board for inspection and the circuit board for connection, thereby the inspection electrodes in the circuit board for inspection and their corresponding terminal electrodes in the circuit board for connection are electrically connected through the conductive parts for connection in the anisotropically conductive connector.

* * * * *